(12) United States Patent
Nakamura et al.

(10) Patent No.: US 8,435,718 B2
(45) Date of Patent: *May 7, 2013

(54) UPPER LAYER-FORMING COMPOSITION AND PHOTORESIST PATTERNING METHOD

(75) Inventors: Atsushi Nakamura, Tokyo (JP); Hiroki Nakagawa, Tokyo (JP); Hiromitsu Nakashima, Tokyo (JP); Takayuki Tsuji, Tokyo (JP); Hiroshi Dougauchi, Tokyo (JP); Daita Kouno, Tokyo (JP); Yukio Nishimura, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/272,501

(22) Filed: Oct. 13, 2011

(65) Prior Publication Data

US 2012/0028198 A1  Feb. 2, 2012

Related U.S. Application Data

(63) Continuation of application No. 12/091,712, filed as application No. PCT/JP2006/321247 on Oct. 25, 2006, now Pat. No. 8,076,053.

(30) Foreign Application Priority Data

Oct. 27, 2005 (JP) ................... 2005-312775
Mar. 27, 2006 (JP) ................... 2006-085223

(51) Int. Cl.
*G03F 7/00* (2006.01)
*G03F 7/004* (2006.01)
*G03F 7/11* (2006.01)
*G03F 7/40* (2006.01)

(52) U.S. Cl.
USPC ............. 430/270.1; 430/273.1; 430/331

(58) Field of Classification Search ............ 430/270.1, 430/331, 271.1, 273.1
See application file for complete search history.

(56) References Cited

U.S. PATENT DOCUMENTS

| 3,895,949 A | 7/1975 | Akamatsu et al. |
|---|---|---|
| 7,316,886 B2 | 1/2008 | Kanda |
| 7,473,512 B2 | 1/2009 | Houlihan et al. |

(Continued)

FOREIGN PATENT DOCUMENTS

| EP | 1708027 | 10/2006 |
|---|---|---|
| EP | 1806370 | 7/2007 |

(Continued)

OTHER PUBLICATIONS

Extended European Search Report for corresponding EP Application No. 06822224, Jun. 23, 2010.

(Continued)

*Primary Examiner* — Amanda C. Walke
(74) *Attorney, Agent, or Firm* — Ditthavong Mori & Steiner, P.C.

(57) ABSTRACT

An upper layer-forming composition includes a resin, and a solvent. The resin is dissolvable in a developer for a photoresist film which is to be covered by the upper layer-forming composition to form a pattern by exposure to radiation. The solvent dissolves the resin in the solvent. The solvent includes a compound shown by a formula (1). Each of $R^1$ and $R^2$ independently represents a hydrocarbon group having 1 to 8 carbon atoms or a halogenated hydrocarbon group.

$$R^1{-}O{-}R^2 \qquad (1)$$

12 Claims, 1 Drawing Sheet

U.S. PATENT DOCUMENTS

| | | | |
|---|---|---|---|
| 7,608,386 B2 | 10/2009 | Nozaki et al. | |
| 7,642,034 B2 | 1/2010 | Hatakeyama et al. | |
| 7,670,750 B2 | 3/2010 | Harada et al. | |
| 7,759,047 B2 | 7/2010 | Hatakeyama et al. | |
| 7,781,142 B2 | 8/2010 | Chiba et al. | |
| 8,076,053 B2 * | 12/2011 | Nakamura et al. | 430/270.1 |
| 2003/0152845 A1 | 8/2003 | Kumada et al. | |
| 2003/0235782 A1 | 12/2003 | Padmanaban et al. | |
| 2005/0186516 A1 | 8/2005 | Endo et al. | |
| 2005/0233254 A1 | 10/2005 | Hatakeyama et al. | |
| 2005/0250898 A1 | 11/2005 | Maeda et al. | |
| 2005/0266354 A1 | 12/2005 | Li et al. | |
| 2006/0029884 A1 | 2/2006 | Hatakeyama et al. | |
| 2006/0036005 A1 | 2/2006 | Kanda et al. | |
| 2006/0141400 A1 | 6/2006 | Hirayama et al. | |
| 2007/0122741 A1 | 5/2007 | Hatakeyama et al. | |
| 2007/0134593 A1 | 6/2007 | Hirayama et al. | |
| 2007/0269734 A1 | 11/2007 | Kimura et al. | |
| 2008/0032202 A1 | 2/2008 | Ishizuka et al. | |
| 2009/0061360 A1 | 3/2009 | Takebe et al. | |
| 2009/0142715 A1 | 6/2009 | Araki et al. | |

FOREIGN PATENT DOCUMENTS

| | | |
|---|---|---|
| JP | 06-12452 | 1/1994 |
| JP | 11-176727 | 7/1999 |
| JP | 2003-233189 | 8/2003 |
| JP | 2005-099648 | 4/2005 |
| JP | 2005-157259 | 6/2005 |
| JP | 2005-264131 | 9/2005 |
| JP | 2005-275365 | 10/2005 |
| JP | 2005-316352 | 11/2005 |
| KR | 2005-106441 | 11/2005 |
| KR | 2007-7156 | 1/2007 |
| TW | 200424767 | 11/2004 |
| WO | WO 2004014960 | 2/2004 |
| WO | WO 2005/019937 | 3/2005 |
| WO | WO 2005069076 | 7/2005 |
| WO | WO 2005/098541 | 10/2005 |
| WO | WO 2005-103098 | 11/2005 |

OTHER PUBLICATIONS

"Properties of Solvents on Various Sorbents", HPLC-Solvent Properties.

"2-Methyl Butanol™ A colorless liquid with a characteristic very mild odor", Dow Chemical company.

"Isobutanol™ A clear colorless solvent with a sweet musty odor", Dow Chemical company.

"Methyl Isobutyl Carbinol a colorless stable liquid with a mild alcohol odor", Dow Chemical company.

"Primary Amyl Alcohol a colorless liquid with a mild and characteristic odor", Dow Chemical company.

Reasons for the demand for the invalidation trail filed in the corresponding KR Application, Dec. 27, 2010.

Taiwanese Office Action for corresponding TW Application No. 095139750, Oct. 17, 2012.

* cited by examiner

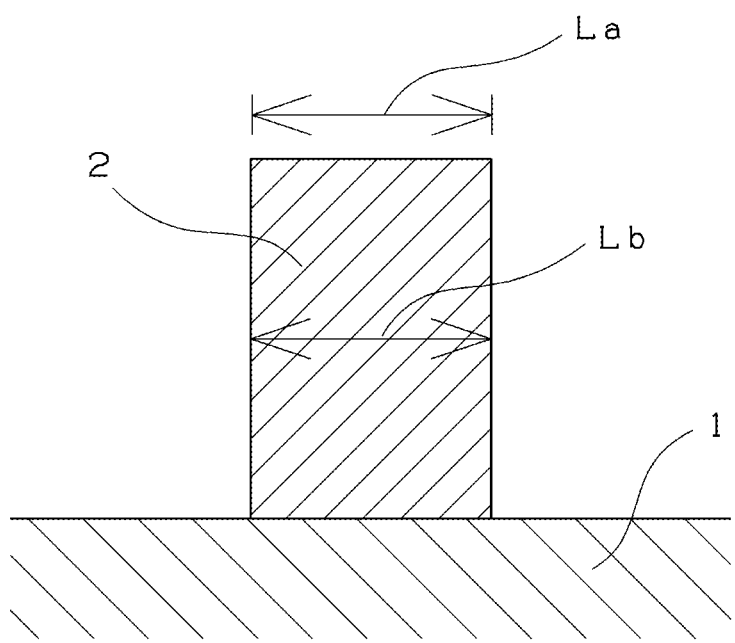

UPPER LAYER-FORMING COMPOSITION AND PHOTORESIST PATTERNING METHOD

CROSS-REFERENCE TO RELATED APPLICATIONS

The present application is a continuation application of the U.S. patent application Ser. No. 12/091,712, filed on Apr. 25, 2008, which in turn is a national stage application of International Application No. PCT/JP2006/321247, filed on Oct. 25, 2006, which claims priority under 35 U.S.C. §119 to Japanese Patent Application No. 2005-312775, filed on Oct. 27, 2005, and to Japanese Patent Application No. 2006-85223, filed on Mar. 27, 2006. The contents of these applications are incorporated herein by reference in their entirety.

BACKGROUND OF THE INVENTION

1. Field of the Invention

The present invention relates to an upper layer-forming composition and a photoresist patterning method.

2. Discussion of the Background

A stepper-type or step-and-scan-type projection aligner is used in the manufacture of semiconductor devices and the like to transfer a reticle pattern as a photo mask to each shot region on a wafer coated with a photoresist through a projection optical system.

The resolution of a projection optical system provided in the projection aligner increases as the exposure wavelength used becomes shorter and the numerical aperture of the projection optical system becomes greater. Therefore, the exposure wavelength which is a wavelength of radiation used in the projection aligner has been reduced in accordance with scaling down of integrated circuits year by year, and the numerical aperture of the projection optical system has been increased.

Depth of focus is as important as resolution. Resolution R and depth of focus δ are respectively shown by the following formulas, $$R = k1 \cdot \lambda / NA \tag{i}$$

$$\delta = k2 \cdot \lambda / NA^2 \tag{ii}$$

wherein λ is the exposure wavelength, NA is the numerical aperture of the projection optical system, and k1 and k2 are process coefficients. When obtaining the same resolution R, a larger depth of focus δ is obtained by using radiation with a shorter wavelength.

A photoresist film is formed on the surface of an exposure target wafer, and the pattern is transferred to the photoresist film. In a common projection aligner, the space in which the wafer is placed is filled with air or nitrogen. When the space between the wafer and the lens of the projection aligner is filled with a medium having a refractive index of n, the resolution R and the depth of focus δ are shown by the following formulas.

$$R = k1 \cdot (\lambda/n) / NA \tag{iii}$$

$$\delta = k2 \cdot n\lambda / NA^2 \tag{iv}$$

For example, when water is used as the above medium in an ArF process, the resolution R is 69.4% (R=k1·(λ/1.44)/NA) and the depth of focus is 144% (δ=k2·1.44λ/NA²) in the case in which the photoresist is exposed through air or nitrogen, when the refractive index of light with a wavelength of 193 nm is n=1.44.

Such a projection exposure method to transfer detailed patterns by reducing the wavelength of emitted light is called a liquid immersion lithographic method and is regarded as an essential technique for miniaturizing lithography, particularly lithography of the order of several tens of nanometers. And the projection aligner for the method is also known (see Japanese Unexamined Patent Application Publication JP-A-11-176727).

In the liquid immersion lithographic method using water as a medium of immersion, a photoresist film formed on a wafer and the lens of a projection aligner are respectively brought into contact with water. The water may permeate the photoresist film and reduce the photoresist resolution. In addition, the components forming the photoresist may be eluted into the water and may pollute the surface of the lens of the projection aligner.

A method of forming an upper layer film on a photoresist film may be used in order to block contact between the photoresist film and the medium such as water. Such an upper layer film must possess sufficient transparency to radiation with a wavelength used in liquid immersion lithography, must form a protective film on a photoresist film while causing almost no intermixing with the photoresist film, must be stably maintained without being dissolved in the medium such as water during liquid immersion lithography, and must be easily dissolved in a developer such as an alkaline solution.

SUMMARY OF THE INVENTION

According to one aspect of the present invention, an upper layer-forming composition includes a resin, and a solvent. The resin is dissolvable in a developer for a photoresist film which is to be covered by the upper layer-forming composition to form a pattern by exposure to radiation. The solvent dissolves the resin in the solvent. The solvent includes a compound shown by a formula (1).

$$R^1 - O - R^2 \tag{1}$$

Each of $R^1$ and $R^2$ independently represents a hydrocarbon group having 1 to 8 carbon atoms or a halogenated hydrocarbon.

According to another aspect of the present invention, a photoresist patterning method includes applying a photoresist composition to a substrate to form a photoresist film. The upper layer-forming composition is applied on the photoresist film to form an upper layer film. The photoresist film and the upper layer film are irradiated with radiation using a liquid as a medium through a mask having a specific pattern to form a resist pattern. The resist pattern is developed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 1 is a cross-sectional view of a line-and space pattern.

DESCRIPTION OF THE EMBODIMENTS

The embodiment of the present invention provides an upper layer-forming composition covering a photoresist film for forming a pattern by exposure to radiation, which includes a resin dissolvable in a developer for the photoresist film and a solvent with a viscosity of less than $5.2 \times 10^{-3}$ Pa·s at 20° C.

in which the resin is dissolved. The solvent does not cause intermixing of the photoresist film and the upper layer-forming composition.

The term "does not cause intermixing" indicates the case in which the resist coating film and the upper layer film for use in immersion lithography are judged to cause no intermixing in the later-described evaluation of intermixing.

The solvent used for the upper layer-forming composition of the embodiment of the present invention includes a compound shown by the following formula (1).

$$R^1-O-R^2 \qquad (1)$$

In the formula (1), $R^1$ and $R^2$ individually represent a hydrocarbon group having 1 to 8 carbon atoms or a halogenated hydrocarbon group.

A solvent containing the compound shown by the formula (1) is a mixture with a monohydric alcohol solvent having 1 to 10 carbon atoms.

The upper layer-forming composition of the embodiment of the present invention is composed of a resin having at least one recurring unit selected from the group consisting of recurring units having a group shown by the following formula (2), (3), or (4), a carboxyl group, and a sulfo group, and has a weight average molecular weight measured by gel permeation chromatography of 2,000 to 100,000.

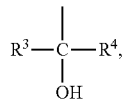
(2)

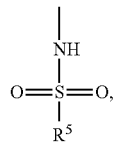
(3)

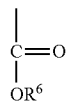
(4)

In the formula (2), $R^3$ and $R^4$ individually represent a hydrogen atom, an alkyl group having 1 to 4 carbon atoms, or a fluoroalkyl group having 1 to 4 carbon atoms. In the formula (3), $R^5$ represents a fluoroalkyl group having 1 to 20 carbon atoms. In the formula (4), $R^6$ represents an organic group having a polar group.

The upper layer-forming composition of the embodiment of the present invention further includes at least one component selected from a group consisting of an acid component and an acid-generator component which generates an acid by being exposed to radiation.

The photoresist patterning method of the embodiment of the present invention includes a step of forming a photoresist film by applying a photoresist composition to a substrate, a step of forming an upper layer film on the photoresist film using the upper layer-forming composition of the embodiment of the present invention, and a step of forming a resist pattern by irradiating the photoresist film and the upper layer film with radiation using a liquid as a medium through a mask having a specific pattern, and developing the photoresist pattern.

Since the solvent used for the upper layer-forming composition of the embodiment of the present invention has a viscosity of less than $5.2 \times 10^{-3}$ Pa·s at 20° C., the amount of composition to be applied homogeneously on a silicon wafer can be reduced. In addition, since the composition contains the solvent comprising an ether of the formula (1) or a hydrocarbon compound having 7 to 11 carbon atoms, the composition can not only protect the photoresist film used in a liquid immersion lithographic method for miniaturizing lithography, but can also form an upper layer film for protecting a lens used in the projection aligner by suppressing elusion of photoresist components. The composition thus exhibits performance equivalent to or better than the upper layer film composition for use in immersion lithography in which a monohydric alcohol is used as a major component.

The embodiments will now be described with reference to the accompanying drawings, wherein like reference numerals designate corresponding or identical elements throughout the various drawings.

When water is used as an immersion medium, the upper layer film made from the upper layer-forming composition inhibits the photoresist film from coming into direct contact with water during the liquid immersion lithography, thereby preventing the photoresist film from reducing the lithographic performance due to penetration of water and preventing the lens of the projection aligner from being polluted with components eluted from the photoresist film.

As the solvent for dissolving the resin component of the upper layer-forming composition, a solvent exhibiting an almost no adverse effect on the lithographic performance by intermixing and the like with the photoresist film when applied to the photoresist film can be used.

The viscosity of the solvent used in the embodiment of the present invention is preferably less than $5.2 \times 10^{-3}$ Pa·s at 20° C. If the viscosity of the solvent is $5.2 \times 10^{-3}$ Pa·s or more at 20° C., the amount of application must be increased in order to ensure in-plane uniformity. In the embodiment of the present invention, the viscosity of the solvent indicates the viscosity of the solvent as a whole.

In order to reduce the viscosity to less than $5.2 \times 10^{-3}$ Pa·s, the solvent preferably contains a solvent containing the ether of the formula (1).

In the formula (1), $R^1$ and $R^2$ individually represent a hydrocarbon group having 1 to 8 carbon atoms and a halogenated hydrocarbon group.

As examples of the solvent containing ethers shown by the formula (1), diethyl ether, dipropyl ether, diisopropyl ether, butyl methyl ether, butyl ethyl ether, butyl propyl ether, dibutyl ether, diisobutyl ether, tert-butyl methyl ether, tert-butyl ethyl ether, tert-butyl propyl ether, di-tert-butyl ether, dipentyl ether, diisoamyl ether, dihexyl ether, dioctyl ether, cyclopentyl methyl ether, cyclohexyl methyl ether, cyclododecyl methyl ether, cyclopentyl ethyl ether, cyclohexyl ethyl ether, cyclopentyl propyl ether, cyclopentyl 2-propyl ether, cyclohexyl propyl ether, cyclohexyl 2-propyl ether, cyclopentyl butyl ether, cyclopentyl-tert-butyl ether, cyclohexyl butyl ether, cyclohexyl-tert-butyl ether, bromomethyl methyl ether, iodomethyl methyl ether, α,α-dichloromethyl methyl ether, chloromethyl ethyl ether, 2-chloroethyl methyl ether, 2-bromoethyl methyl ether, 2,2-dichloroethyl methyl ether, 2-chloroethyl ethyl ether, 2-bromoethyl ethyl ether, (±)-1,2-dichloroethyl ethyl ether, di-2-bromoethyl ether, 2,2,2-trifluoroethyl ether, chloromethyl octyl ether, bromomethyl octyl ether, di-2-chloroethyl ether, ethyl vinyl ether, butyl vinyl ether, aryl ethyl ether, aryl propyl ether, aryl butyl ether, diaryl ether, 2-methoxypropene, ethyl-1-propenyl ether, 1-methoxy-1,3-butadiene, cis-1-bromo-2-ethoxyethylene, 2-chloroethyl vinyl ether, and aryl-1,1,2,2-tetrafluoroethyl ether can be given. Examples of preferable ethers include dipropyl ether, diisopropyl ether, butyl methyl ether, butyl ethyl ether, butyl propyl ether, dibutyl ether, diisobutyl ether, tert-butyl-methyl ether, tert-butyl ethyl ether, tert-butyl propyl ether, di-tert-butyl ether, dipentyl ether, diisoamyl ether, cyclopentyl methyl ether, cyclohexyl methyl ether, cyclopentyl ethyl ether, cyclohexyl ethyl ether, cyclopentyl propyl ether, cyclopentyl-2-propyl ether, cyclohexyl propyl ether, cyclohexyl-2-propyl ether, cyclopentyl butyl ether, cyclopentyl-tert-butyl ether, cyclohexyl butyl ether, and cyclohexyl-tert-butyl ether.

The above ethers are used in combination with other solvents. As examples of the solvents used with the above ethers, monohydric alcohols, polyhydric alcohols, cyclic ethers, alkyl ethers of polyhydric alcohols, alkyl ether acetates of polyhydric alcohols, aromatic hydrocarbons, ketones, esters, water, and the like can be given.

Examples of monohydric alcohols include methanol, ethanol, 1-propanol, isopropanol, n-propanol, 2-methyl-1-propanol, n-butanol, 2-butanol, tert-butanol, 1-pentanol, 2-pentanol, 3-pentanol, n-hexanol, cyclohexanol, 2-methyl-2-butanol, 3-methyl-2-butanol, 2-methyl-1-butanol, 3-methyl-1-butanol, 2-methyl-1-pentanol,
2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2-ethyl-1-butanol, 2,2-dimethyl-3-pentanol, 2,3-dimethyl-3-pentanol, 2,4-dimethyl-3-pentanol,
4,4-dimethyl-2-pentanol, 3-ethyl-3-pentanol, 1-heptanol, 2-heptanol, 3-heptanol, 2-methyl-2-hexanol, 2-methyl-3-hexanol, 5-methyl-1-hexanol, 5-methyl-2-hexanol, 2-ethyl-1-hexanol, methylcyclohexanol, trimethylcyclohexanol, 4-methyl-3-heptanol, 6-methyl-2-heptanol, 1-octanol, 2-octanol, 3-octanol,
2-propyl-1-pentanol, 2,4,4-trimethyl-1-pentanol,
2,6-dimethyl-4-heptanol, 3-ethyl-2,2-dimethyl-pentanol, 1-nonanol, 2-nonanol, 3,5,5-trimethyl-1-hexanol, 1-decanol, 2-decanol, 4-decanol, 3,7-dimethyl-1-octanol, and 3,7-dimethyl-3-octanol.

Among the monohydric alcohols, monohydric alcohols having 4 to 8 carbon atoms are preferable. Specifically, 2-methyl-1-propanol, 1-butanol, 2-butanol, 1-pentanol, 2-pentanol, 3-pentanol, 3-methyl-2-pentanol, 4-methyl-2-pentanol, 2-ethyl-1-butanol, 2,4-dimethyl-3-pentanol are preferable.

Examples of the polyhydric alcohols include ethylene glycol and propylene glycol. Examples of the cyclic ethers include tetrahydrofuran and dioxane. Examples of the alkyl ethers of polyhydric alcohol include ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether, and propylene glycol monoethyl ether. Examples of the alkyl ether acetates of polyhydric alcohol include ethylene glycol ethyl ether acetate, diethylene glycol ethyl ether acetate, propylene glycol ethyl ether acetate, and propylene glycol monomethyl ether acetate. Examples of the aromatic hydrocarbons include benzene, toluene, and xylene. Examples of the ketones include acetone, methyl ethyl ketone, methyl isobutyl ketone, cyclohexanone, 4-hydroxy-4-methyl-2-pentanone, and diacetone alcohol.

Examples of the esters include ethyl acetate, butyl acetate, ethyl 2-hydroxypropionate, methyl 2-hydroxy-2-methyl-propionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, and methyl 3-ethoxypropionate.

Of these, the monohydric alcohols, cyclic ethers, alkyl ethers of polyhydric alcohols, alkyl ether acetates of polyhydric alcohols, ketones, esters, and water are preferable, with the monohydric alcohols being more preferable.

When the above ethers are used with the other solvents, it is preferable that the amount of the other solvents be not more than 75 wt % of the entire solvent. If the amount of the other solvents is not more than 75 wt %, not only the viscosity of the mixed solvent at 20° C. can be controlled to less than $5.2 \times 10^{-3}$ Pa·s, and preferably in a range of $0.7 \times 10^{-3}$ Pa·s to $4.0 \times 10^{-3}$ Pa·s, but also the amount of the upper layer-forming composition to be homogeneously applied on a silicon wafer can be decreased and elusion of anionic components from the composition can be further suppressed.

The solvent used in the embodiment of the present invention does not cause intermixing between the photoresist film and the upper layer-forming composition.

Some solvents, for example, tetrahydrofuran, propylene glycol monomethyl ether acetate, methyl ethyl ketone, and the like which may corrode a resist film and cause intermixing if used alone are preferably used under the conditions which the solvent is judged not to cause intermixing when evaluated according to the later-described evaluation method. These solvents are used in an amount of 30 wt % or less, and preferably 20 wt % or less of the total amount of the solvents used. If more than 30 wt %, the photoresist film may be corroded and may cause intermixing with the upper layer film, leading to significant deterioration of resolution performance of the photoresist.

As examples of preferable solvents used in the embodiment of the present invention, a mixture of an ether of the formula (1) in which $R^1$ and $R^2$ individually represent hydrocarbon groups having 1 to 8 carbon atoms and a monohydric alcohol having 4 to 8 carbon atoms can be given.

The resin which constitutes the upper layer-forming composition of the embodiment is a resin capable of forming a film stable to a medium such as water during exposure to radiation and dissolvable in the developer used for forming a resist pattern.

The term "film stable in a medium such as water during exposure to radiation" indicates a film of which the thickness change when measuring by a stability evaluation method in water mentioned later, for example, is not more than 3% of the initial film thickness.

The term "dissolvable in the developer used for forming a resist pattern" indicates the upper layer film can be removed to the extent that there is no residue observed by the naked eye on the resist pattern after development using an alkaline aqueous solution. That is to say, the resin used in the embodiment has almost no solubility in a medium such as water, but is dissolved in the alkaline aqueous solution used for developing the photoresist pattern after exposure to radiation (such a resin of the embodiment is hereinafter referred to as "alkali-soluble resin").

The upper layer film made from such an alkali-soluble resin inhibits the photoresist film from coming in direct contact with the medium such as water during the liquid immersion lithography, thereby preventing the photoresist film from reducing the lithographic performance due to penetration of the medium and also preventing the lens of the projection aligner from being polluted with components eluted from the photoresist film.

The resin contains at least one recurring unit selected from a group consisting of a recurring unit having a group shown by the following formula (2), a recurring unit having a group shown by the following formula (3), a recurring unit having a group shown by the following formula (4), a recurring unit having a carboxyl group, and a recurring unit having a sulfo group. These recurring units can be incorporated in the resin by polymerizing a radically-polymerizable monomer which contains these units and a polymerizable unsaturated bond.

In the recurring unit having a group shown by the formula (2), examples of the alkyl group having 1 to 4 carbon atoms include a methyl group, an ethyl group, a propyl group, and a butyl group, and examples of the fluoroalkyl group having 1 to 4 carbon atoms include a difluoromethyl group, a perfluoromethyl group, a 2,2-difluoroethyl group, a 2,2,2-trifluoroethyl group, a perfluoroethyl group, a 2,2,3,3,-tetrafluoropropyl group, a perfluoroethylmethyl group, a perfluoropropyl group, a 2,2,3,3,4,4-hexafluorobutyl group, a perfluorobutyl group, a 1,1-dimethyl-2,2,3,3-tetrafluoropropyl group, and the like.

Of these groups, a perfluoromethyl group is preferable.

The recurring unit having a group shown by the formula (2) is a recurring unit having an alcoholic hydroxyl group which contains on the side chain at least one fluoroalkyl group on at least α-position carbon atom. The hydrogen atom of the alcoholic hydroxyl group is easily released due to electron withdrawing properties of a fluoroalkyl group, particularly a perfluoromethyl group. As a result, the resin exhibits acidity in an aqueous solution. Therefore, the resin is insoluble in pure water, but soluble in alkali.

The recurring unit shown by the following formula (2a) can be given as a preferable example of the recurring unit having the group shown by the formula (2).

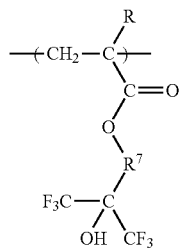

(2a)

wherein R represents a hydrogen atom or a methyl group, and $R^7$ represents an organic group, and preferably a divalent hydrocarbon group. Linear hydrocarbon groups and cyclic hydrocarbon groups are preferable among the divalent hydrocarbon group.

Preferable examples of $R^7$ include a methylene group; an ethylene group; a propylene group such as a 1,3-propylene group and a 1,2-propylene group; a saturated linear hydrocarbon group such as a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, an icosa methylene group, a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, and a 2-propylidene group; a monocyclic hydrocarbon ring group, such as a cycloalkylene group having 3 to 10 carbon atoms, for example, a cyclobutylene group such as a 1,3-cyclobutylene group, a cyclopentylene group such as a 1,3-cyclopentylene group, a cyclohexylene group such as a 1,4-cyclohexylene group, and a cyclooctylene group such as a 1,5-cyclooctylene group; crosslinked cyclic hydrocarbon ring groups such as a cyclic hydrocarbon group having 2 to 4 rings and 4 to 30 carbon atoms, for example, a norbornylene group such as a 1,4-norbornylene group and 2,5-norbornylene group, and an adamantylene group such as 1,5-adamantylene group, and 2,6-adamantylene group, and the like.

Particularly when the $R^7$ is a divalent alicyclic hydrocarbon group, it is preferable to insert an alkylene group having 1 to 4 carbon atoms as a spacer between the bis(trifluoromethyl) hydroxymethyl group and the alicyclic hydrocarbon group.

Preferable groups represented by $R^7$ in the formula (2a) are a hydrocarbon group having a 2,5-norbornylene group or a 2,6-norbornylene group, and a 1,2-propylene group.

In the recurring unit having a group shown by the formula (3), examples of the fluoroalkyl group having 1 to 20 carbon atoms represented by $R^5$ include a fluoroalkyl group having 1 to 20 carbon atoms such as a difluoromethyl group, a perfluoromethyl group, a 2,2-difluoroethyl group, a 2,2,2-trifluoroethyl group, a perfluoroethyl group, a 2,2,3,3,-tetrafluoropropyl group, a perfluoroethylmethyl group, a perfluoropropyl group, a 2,2,3,3,4,4-hexafluorobutyl group, a perfluorobutyl group, a 1,1-dimethyl-2,2,3,3-tetrafluoropropyl group, a 1,1-dimethyl-2,2,3,3,3-pentafluoropropyl group, a 2-(perfluoropropyl)ethyl group, a 2,2,3,3,4,4,5,5-octafluoropentyl group, a perfluoropentyl group, a 1,1-dimethyl-2,2,3,3,4,4-hexafluorobutyl group, a 1,1-dimethyl-2,2,3,3,4,4,4-heptafluorobutyl group, a 2-(perfluorobutyl)ethyl group, a 2,2,3,3,4,4,5,5,6,6-decafluorohexyl group, a perfluoropentylmethyl group, a perfluorohexyl group, a 1,1-dimethyl-2,2,3,3,4,4,5,5-octafluoropentyl group, a 1,1-dimethyl-2,2,3,3,4,4,5,5,5-nonafluoropentyl group, a 2-(perfluoropentyl)ethyl group, a 2,2,3,3,3,4,4,5,5,6,6,7,7-dodecafluoroheptyl group, a perfluorohexylmethyl group, a perfluoroheptyl group, a 2-(perfluorohexyl)ethyl group, a 2,2,3,3,4,4,5,5,6,6,7,7,8,8-tetradecafluorooctyl group, a perfluoroheptylmethyl group, a perfluorooctyl group, a 2-(perfluoroheptyl)ethyl group, a 2,2,3,3,4,4,5,5,6,6,7,7,8,8,9,9-hexadecafluorononyl group, a perfluorooctylmethyl group, a perfluorononyl group, a 2-(perfluorooctyl)ethyl group, a 2,2,3,3,4,4,5,5,6,6,7,7,8,8,9,9,10,10-octadecafluorodecyl group, a perfluorononylmethyl group, a perfluorodecyl group, a 2,2,3,4,4,4-hexafluorobutyl group, a 2,2,3,3,4,4,4-heptafluorobutyl group, a 3,3,4,4,5,5,6,6,6-nonafluorohexyl group, a 3,3,4,4,5,5,6,6,7,7,8,8,8-tridodecafluorooctyl group, and the like.

Of these, a perfluoromethyl group, a perfluoroethyl group, a perfluoropropyl group, a perfluorobutyl group, and a perfluorooctyl group are particularly preferable in order to have the appropriate acidity of the hydrogen bonded to the nitrogen atom.

The recurring unit shown by the following formula (3a) can be given as a preferable example of the recurring unit having the group shown by the formula (3).

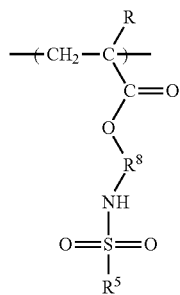

(3a)

wherein R represents a hydrogen atom or a methyl group, and $R^5$ is the same as the $R^5$ in the formula (3).

$R^8$ represents an organic group, and preferably a divalent hydrocarbon group. Linear hydrocarbon groups and cyclic hydrocarbon groups are preferable among the divalent hydrocarbon group.

Preferable examples of $R^8$ include a methylene group; an ethylene group; a propylene group such as a 1,3-propylene group and a 1,2-propylene group; an unsaturated linear hydrocarbon group such as a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, an icosa methylene group, a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, and a 2-propylidene group; a monocyclic hydrocarbon ring group, such as a cycloalkylene group having 3 to 10 carbon atoms, for example, a cyclobutylene group such as a 1,3-cyclobutylene group, a cyclopentylene group such as a 1,3-cyclopentylene group, a cyclohexylene group such as a 1,4-cyclohexylene group, and a cyclooctylene group such as a 1,5-cyclooctylene group; crosslinked cyclic hydrocarbon groups such as a cyclic hydrocarbon group having 2 to 4 rings and 4 to 30 carbon atoms, for example, a norbornylene group such as a 1,4-norbornylene group and 2,5-norbornylene group, and an adamantylene group such as 1,5-adamantylene group and 2,6-adamantylene group; and the like.

Particularly when the $R^8$ is a divalent alicyclic hydrocarbon group, an alkylene group having 1 to 4 carbon atoms may be inserted as a spacer between an —NH— group and the alicyclic hydrocarbon group.

As $R^8$, a hydrocarbon group having a 2,5-norbornylene group or a 1,5-adamantylene group, an ethylene group, and a 1,3-propylene group are preferable.

In the recurring unit having a group shown by the formula (4), $R^6$ represents an organic group having a polar group, preferably a hydrocarbon group having a monovalent polar group having 1 to 20 carbon atoms or a fluorinated hydrocarbon group.

The recurring unit shown by the following formula (4a) can be given as a preferable example of the recurring unit having the group shown by the formula (4).

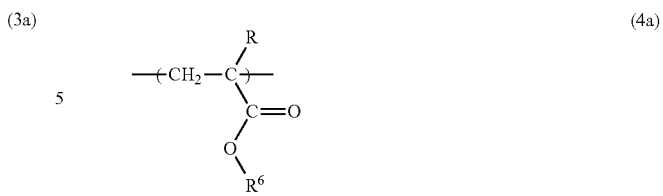

(4a)

wherein R represents a hydrogen atom or a methyl group, and $R^6$ represents a residue of an alcohol which forms an ester bond with (meth)acrylic acid and has a polar group.

Examples of preferable $R^6$ include a hydroxymethyl group, a 1-hydroxyethyl group, a 2-hydroxyethyl group, a 1-hydroxypropyl group, a 2-hydroxypropyl group, a 3-hydroxypropyl group, a 2-hydroxybutyl group, a 2,3-dihydroxypropyl group, a polypropyleneglycol group, a 2-hydroxycyclohexyl group, a 4-hydroxycyclohexyl group, a 3-hydroxy-1-adamantyl group, a 3,5-dihydroxy-1-adamantyl group, an aminomethyl group, a 1-aminoethyl group, a 2-aminoethyl group, a 1-aminopropyl group, a 2-aminopropyl group, a 3-aminopropyl group, a 2,3-dihydroxypropyl group, a 1,2,3-trihydroxypropyl group, a difluoromethyl group, a perfluoromethyl group, a 2,2-difluoroethyl group, a 2,2,2-trifluoroethyl group, a perfluoroethyl group, a 1-(perfluoromethyl)ethyl group, a 2-(perfluoromethyl)ethyl group, a 2,2,3,3-tetrafluoropropyl group, a perfluoroethylmethyl group, a di(perfluoromethyl)methyl group, a perfluoropropyl group, a 1-methyl-2,2,3,3-tetrafluoropropyl group, a 1-(perfluoroethyl)ethyl group, a 2-(perfluoroethyl)ethyl group, a 2,2,3,3,4,4-hexafluorobutyl group, a perfluoropropylmethyl group, a perfluorobutyl group, a perfluoropentyl group, a perfluorohexyl group, a perfluoroheptyl group, a perfluorooctyl group, a perfluorononyl group, a perfluorodecyl group, a (2,2,2-trifluoroethyl)α-carboxyl group, a (perfluoroethylmethyl)α-carboxyl group, a (2,2,2-trifluoroethyl)α-carboxymethyl group, a (2,2,2-trifluoroethyl)α-cyano group, a (perfluoroethylmethyl)α-cyano group, a (2,2,3,3,3-pentafluoropropyl)-2-ethoxy group, a (2,2,3,3,3-pentafluoropropyl)-2-cyano group.

As examples of the radical polymerizable monomer generating a recurring unit having a carboxyl group, unsaturated monocarboxylic acids such as (meth)acrylic acid, crotonic acid, cinnamic acid, atropic acid, 3-acetyloxy(meth)acrylate, 3-benzoiloxy(meth)acrylate, α-methoxyacrylate, 3-cyclohexyl(meth)acrylate; unsaturated polycarboxylic acids such as fumaric acid, maleic acid, citraconic acid, mesaconic acid, itaconic acid; monoesters (e.g., monomethyl ester, monoethyl ester, mono-n-propyl ester, and mono-n-butyl ester) of the unsaturated polycarboxylic acids; 2-(meth)acrylamide-2-methylpropanecarboxylic acid, 2-α-carboxyacrylamide-2-methylpropanecarboxylic acid, 2-α-carboxymethylacrylamide-2-methylpropanecarboxylic acid, 2-α-methoxycarbonylacrylamide-2-methylpropanecarboxylic acid, 2-α-acetyloxyacrylamide-2-methylpropanecarboxylic acid, 2-α-phenylacrylamide-2-methylpropanecarboxylic acid, 2-α-benzylacrylamide-2-methylpropanecarboxylic acid, 2-α-methoxyacrylamide-2-methylpropanecarboxylic acid, 2-α-cyclohexylacrylamide-2-methylpropanecarboxylic acid, 2-α-cyanoacrylamide-2-methylpropanecarboxylic acid, and the like can be given.

Among the above monomers, (meth)acrylic acid and crotonic acid are preferable.

As the recurring unit having a carboxyl group, a radical polymerizable monomer shown by the formula (5) can be given.

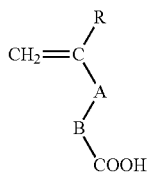

(5)

wherein R represents a hydrogen atom or a methyl group, A represents a single bond, a carbonyl group, a carbonyloxy group, and an oxycarbonyl group, and B represents a single bond and a divalent organic group having 1 to 20 carbon atoms. Examples of the divalent organic group having 1 to 20 carbon atoms include a methylene group; an ethylene group; a propylene group such as a 1,3-propylene group and a 1,2-propylene group; an unsaturated linear hydrocarbon group such as a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, an icosa methylene group, a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group and a 2-propylidene group; a monocyclic hydrocarbon ring group, such as an arylene group such as a phenylene group and a tolylene group, a cycloalkylene group having 3 to 10 carbon atoms, for example, a cyclobutylene group such as a 1,3-cyclobutylene group, a cyclopentylene group such as a 1,3-cyclopentylene group, a cyclohexylene group such as a 1,4-cyclohexylene group, and a cyclooctylene group such as a 1,5-cyclooctylene group; crosslinked cyclic hydrocarbon groups such as a cyclic hydrocarbon group having 2 to 4 rings and 4 to 20 carbon atoms, for example, a norbornylene group such as a 1,4-norbornylene group and 2,5-norbornylene group, and an adamantylene group such as 1,5-adamantylene group and 2,6-adamantylene group; and the like.

The radically polymerizable monomers generating the recurring unit having a sulfo group is shown by the following formula (6).

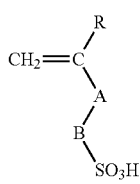

(6)

In the formula (6), A and B are the same as those defined for the formula (5). The formula (6) can be obtained by replacing the carboxyl group in the formula (5) with a sulfo group.

Preferable examples of the monomer shown by the formula (6) include vinylsulfonic acid, allylsulfonic acid, 2-(meth)acrylamide-2-methyl-1-propanesulfonic acid, and 4-vinyl-1-benzenesulfonic acid. Of these sulfonic acid monomers, vinylsulfonic acid and allylsulfonic acid are particularly preferable.

The resin component of the upper layer-forming composition of the embodiment contains at least one recurring unit selected from a group consisting of a recurring unit having a group shown by the above formula (2), a recurring unit having a group shown by the above formula (3), a recurring unit having a group shown by the above formula (4), a recurring unit having a carboxyl group, and a recurring unit having a sulfo group.

In addition, other radically-polymerizable monomers may be copolymerized with the resin component of the upper layer-forming composition of the embodiment in order to control the molecular weight, the glass transition temperature, solubility in solvents, and the like of the resin. The "Other monomers" indicate radically polymerizable monomers other than the above-mentioned radically polymerizable monomers. In addition, an acid-dissociable group-containing monomer may be copolymerized.

As examples of the other radically-polymerizable monomer or acid-dissociable group-containing monomer, (meth) acrylic acid alkyl esters such as methyl(meth)acrylate, ethyl (meth)acrylate, n-butyl(meth)acrylate, sec-butyl(meth) acrylate, tert-butyl(meth)acrylate, isopropyl(meth)acrylate, n-hexyl(meth)acrylate, cyclohexyl(meth)acrylate, 2-methyl-cyclohexyl(meth)acrylate, dicyclopentanyloxyethyl(meth) acrylate, isobornyl(meth)acrylate, dicyclopentanyl(meth) acrylate, methoxydipropyleneglycol(meth)acrylate, butoxy-dipropyleneglycol(meth)acrylate, methoxydiethyleneglycol (meth)acrylate, methoxypropyleneglycol(meth)acrylate, 2-methyl-2-adamantyl(meth)acrylate, 2-ethyl-2-adamantyl (meth)acrylate, 2-propyl-2-adamantyl(meth)acrylate, 2-butyl-2-adamantyl(meth)acrylate, 1-methyl-1-cyclohexyl (meth)acrylate, 1-ethyl-1-cyclohexyl(meth)acrylate, 1-propyl-1-cyclohexyl(meth)acrylate, 1-butyl-1-cyclohexyl (meth)acrylate, 1-methyl-1-cyclopentyl(meth)acrylate, 1-ethyl-1-cyclopentyl(meth)acrylate, 1-propyl-1-cyclopentyl(meth)acrylate, 1-butyl-1-cyclopentyl(meth)acrylate, 1-adamantyl-1-methylethyl(meth)acrylate, and 1-bicyclo [2.2.1]heptyl-1-methylethyl(meth)acrylate; dicarboxylic acid diesters such as maleic acid diesters, fumaric acid diesters, and itaconic acid diesters; (meth) acrylic acid aryl esters such as phenyl(meth)acrylate and benzyl(meth)acrylate; aromatic vinyl esters such as stylene, α-methylstylene, m-methylstylene, p-methylstylene, vinyl toluene, p-methoxystylene; radical polymerizable monomers having a nitrile group such as acrylonitril and methacrylonitrile; radical polymerizable monomers having an amide bond such as acrylamide and methacrylamide; fatty acid vinyl esters such as vinyl acetate; radical polymerizable monomers having a chlorine atom such as vinyl chloride and vinylidene chloride; and conjugated diolefins such as 1,3-butadiene, isoprene and 1,4-dimethylbutadiene can be given. Of these, (meth)acrylic acid alkyl esters, radical polymerizable monomers having a nitrile group, radical polymerizable monomers having an amide bond, and (meth)acrylic acid alkyl esters having a hydroxyl group are preferable.

These monomers may be used either individually or in combination of two or more.

When copolymerized with the other radically-polymerizable monomers, the proportion of the other radically-polymerizable monomers is preferably 50 mol % or less, and more preferably 40 mol % or less of the total amount of the polymer. If more than 50 mol %, the solubility of the resin in an alkaline developer is decreased. Since it is difficult to remove the upper layer film, a residue may remain on the resist pattern after development.

As examples of the polymerization solvents used for preparing the alkali-soluble resins, alcohols such as methanol, ethanol, 1-propanol, 2-propanol, 1-butanol, 2-butanol, ethylene glycol, diethylene glycol, and propylene glycol; cyclic ethers such as tetrahydrofuran and dioxane; alkyl ethers of polyhydric alcohol such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether, and propylene glycol monoethyl ether; alkyl ether acetates of polyhydric alcohol such as ethylene glycol ethyl ether acetate, diethylene glycol ethyl ether acetate, propylene glycol ethyl ether acetate, and propylene glycol monomethyl ether acetate; aromatic hydrocarbons such as toluene and xylene; ketones such as acetone, methyl ethyl ketone, methyl isobutyl ketone, cyclohexanone, 4-hydroxy-4-methyl-2-pentanone, and diacetone alcohol; esters such as ethyl acetate, butyl acetate, methyl-2-hydroxypropionate, ethyl-2-hydroxy-2-methylpropionate, ethyl-2-hydroxy-2-methylpropionate, ethoxy ethyl acetate, hydroxy ethyl acetate, methyl-2-hydroxy-3-methylbutanate, methyl-3-methoxypropionate, ethyl-3-methoxypropionate, ethyl-3-ethoxypropionate, and methyl-3-ethoxypropionate can be given. Of these, cyclic ethers, alkyl ether of polyhydric alcohol, alkyl ether acetates of polyhydric alcohol, ketones, and esters are preferable.

A commonly used radical polymerization initiator can be used as the polymerization catalyst in the radical copolymerization. As examples, azo compounds such as 2,2'-azobisisobutyronitrile, 2,2'-azobis-(2-methylmethylpropionate), 2,2'-azobis-(2,4-dimethylvaleronitrile), 2,2'-azobis-(4-methoxy-2-dimethylvaleronitrile); organic peroxides such as benzoyl peroxide, lauroyl peroxide, tert-butylperoxypivalate, 1,1'-bis-(tert-butylperoxy)cyclohexane; and hydrogen peroxide can be given. When using a peroxide as the radical polymerization initiator, a reducing agent may be combined to form a redox-type initiator.

The polystyrene-reduced weight average molecular weight (hereinafter referred to as "Mw") of the alkali-soluble resin obtained by the above method determined by gel permeation chromatography is generally 2,000 to 100,000, preferably 2,500 to 50,000, and more preferably 3,000 to 20,000. If Mw of the alkali-soluble resin is less than 2,000, water resistance and mechanical properties of the upper layer film is unduly low; if more than 100,000, the solubility in the above-mentioned solvents is significantly low. The ratio of Mw to the polystyrene-reduced number average molecular weight (hereinafter referred to as "Mn") of the resin determined by gel permeation chromatography (GPC) (Mw/Mn) of the copolymer is usually from 1 to 5, and preferably from 1 to 3.

It is preferable that the resin contains impurities such as halogens or metals in an amount as small as possible. The smaller the amount of impurities is, the further it can improve applicability as an upper layer film and the properties of being homogeneously dissolved in an alkaline developer. As a purification method of the resin, a chemical purification method such as washing with water or liquid-liquid extraction and a combination of such a chemical purification method and a physical purification method such as ultrafiltration, centrifugation, or the like can be given. In the embodiment of the present invention, the resins can be used either individually or in combination of two or more.

A surfactant can be blended with the upper layer-forming composition for immersion lithography of the embodiment in order to increase applicability, defoamability, leveling properties, and the like.

As a surfactant, fluorine-containing surfactants commercially available under the trade names of "BM-1000" and "BM-1100" (manufactured by BM CHEMIE Co., Ltd.), "MEGAFAC F142D", "MEGAFAC F172", "MEGAFAC F173", and "MEGAFAC F183" (manufactured by Dainippon Ink and Chemicals, Inc.), "Fluorad FC-135", "Fluorad FC-170C", "Fluorad FC-430", and "Fluorad FC-431 (manufactured by Sumitomo 3M), "Surflon S-112" "Surflon S-113", "Surflon S-131", "Surflon S-141", and "Surflon S-145" (manufactured by Asahi Glass Co., Ltd.), "SH-28PA", "SH-190", "SH-193", "SZ-6032", and "SF-8428" (manufactured by Dow Corning Toray Silicone Co., Ltd.), and the like can be used.

The amount of surfactants to be added is preferably 5 parts by weight or less for 100 parts by weight of the alkali-soluble resin.

In addition, a low molecular compound such as a radiation-sensitive acid generator (hereinafter referred to as "acid generator"), an acid, and the like may be added to the upper layer-forming composition for immersion lithography of the embodiment in order to increase lithography performance of the resist.

As examples of the acid generator, (1) a sulfonimide compound, (2) a disulfonyl methane compound, (3) an onium salt compound, (4) a sulfone compound, (5) a sulfonate compound, (6) a diazomethane compound, and the like can be given.

Examples of these acid generators are given below.
(1) Sulfonimide Compounds

As examples of the sulfonimide compounds, compounds of the following formula (7) can be given,

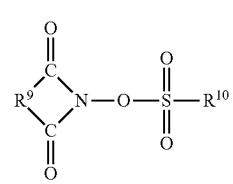

(7)

wherein $R^{10}$ is a monovalent organic group and $R^9$ is a divalent organic group.

The monovalent organic group includes a substituted or unsubstituted linear or branched alkyl group, a substituted or unsubstituted cyclic alkyl group, a substituted or unsubstituted aryl group, a perfluoroalkyl group, and the like, and the divalent organic group includes a substituted or unsubstituted alkylene group, a substituted or unsubstituted alkenylene group, a substituted or unsubstituted phenylene group, and the like.

As examples of the sulfonimide compound, N-(trifluoromethylsulfonyloxy)succineimide, N-(trifluoromethylsulfonyloxy)bicyclo[2.2.1]hept-5-ene-2,3-dicarboxyimide, N-(10-camphorsulfonyloxy)succineimide, N-(10-camphorsulfonyloxy)bicyclo[2.2.1]hept-5-ene-2,3-dicarboxyimide, N-(camphorsulfonyloxy)-7-oxabicyclo[2.2.1]hept-5-ene-dicarboxyimide, N-(p-toluenesulfonyloxy)succineimide, N-(p-toluenesulfonyloxy)bicyclo[2.2.1]hept-5-ene-2,3-dicarboxy imide, N-(4-trifluoromethylbenzenesulfonyloxy)succineimide, N-(4-trifluoromethylbenzenesulfonyloxy)bicyclo[2.2.1]hept-5-ene-2,3-dicarboxylmide, N-(perfluorobenzenesulfonyloxy)succineimide, N-(perfluorobenzenesulfonyloxy)bicyclo[2.2.1]hept-5-ene-2,3-di carboxylmide, N-(nonafluorobutylsulfonyloxy)succineimide, N-(nonafluorobutylsulfonyloxy)bicyclo[2.2.1]hept-5-ene-2,3-dicarboxyimide, N-(perfluorooctanesulfonyloxy)succineimide, N-(perfluorooctanesulfonyloxy)bicyclo[2.2.1]hept-5-ene-2,3-dicarboxyimide, N-(benzenesulfonyloxy)succineimide, N-(benzenesulfonyloxy)bicyclo[2.2.1]hept-5-ene-2,3-dicarboxylmide, N-(benzenesulfonyloxy)-7-oxabicyclo[2.2.1]hept-5-ene-2,3-dicarboxyimide, and N-{(5-methyl-5-carboxymethanebicyclo[2.2.1]hept-2-yl)sulfonylocxy}succineimide can be given.

(2) Disulfonylmethane Compounds

As examples of the disulfonylmethane compounds, compounds of the following formula (8) can be given,

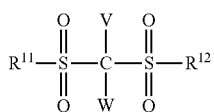

(8)

wherein $R^{11}$ and $R^{12}$ individually represent a linear or branched monovalent aliphatic hydrocarbon group, a cycloalkyl group, an aryl group, an aralkyl group, or another monovalent organic group having a hetero atom, and V and W individually represents an aryl group, a hydrogen atom, a linear or branched monovalent aliphatic hydrocarbon group, or another monovalent organic group having a hetero atom, wherein at least one of V and W is an aryl group, V and W bond to form a monocyclic or polycyclic ring having at least one unsaturated bond, or V and W bond to form a group shown by the following formula (8-1),

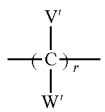

(8-1)

wherein V' and W' individually represent a hydrogen atom, a halogen atom, a linear or branched alkyl group, a cycloalkyl group, an aryl group, or an aralkyl group, or V' and W' bonding to the same carbon atom or different carbon atoms bond together to form a monocyclic hydrocarbon structure (in the case that there are two or more V's and W's, the V's and W's may be either the same or different), and r is an integer of 2 to 10.

(3) Onium Salt Compound

As examples of the onium salt, an iodonium salt, a sulfonium salt, a phosphonium salt, a diazonium salt, an ammonium salt, and a pyridinium salt can be given.

Specific examples of the onium salt compound include bis(4-t-butylphenyl)iodonium nonafluorobutanesulfonate, bis(4-t-butylphenyl)iodonium trifluorobutanesulfonate, bis(4-t-butylphenyl)iodonium perfluorooctanesulfonate, bis(4-t-butylphenyl)iodonium p-toluenesulfonate, bis(4-t-butylphenyl)iodonium 10-camphorsulfonate, 4-trifluoromethylbenzenesulfonate, bis(4-t-butylphenyl)iodonium perfluorobenzenesulfonate, diphenyliodonium nonafluorobutanesulfonate, diphenyliodonium trifluoromethanesulfonate, diphenyliodonium perfluorooctanesulfonate, diphenyliodonium p-toluenesulfonate, diphenyliodoniumbenzenesulfonate, diphenyliodonium 10-camphorsulfonate, diphenyliodonium-4-trifluoromethylbenzenesulfonate, diphenyliodonium perfluorobenzenesulfonate, triphenylsulfonium nonafluorobutanesulfonate, triphenylsulfonium trifluoromethanesulfonate, triphenylsulfonium perfluorooctanesulfonate, triphenylsulfonium p-toluenesulfonate, triphenylsulfoniumbenzenesulfonate, triphenylsulfonium 10-camphorsulfonate, triphenylsulfonium 4-trifluoromethylbenzenesulfonate, triphenylsulfonium perfluorobenzenesulfonate, 4-hydroxyphenyl diphenylsulfonium trifluoromethanesulfonate, tri(p-methoxyphenyl)sulfonium nonafluorobutanesulfonate, tri(p-methoxyphenyl)sulfonium trifluorofluoromethanesulfonate, tri(p-methoxyphenyl)sulfonium perfluorooctanesulfonate, tri(p-methoxyphenyl)sulfonium p-toluenesulfonate, tri(p-methoxyphenyl)sulfonium benzenesulfonate, tri(p-methoxyphenyl)sulfonium 10-camphorsulfonate, bis(p-fluorophenyl)iodonium trifluoromethanesulfonate, bis(p-fluorophenyl)iodonium nonafluoromethanesulfonate, bis(fluorophenyl)iodonium camphorsulfonate, (p-fluorophenyl)(phenyl)iodonium trifluoromethanesulfonate, tris(p-fluorophenyl)sulfonium trifluoromethanesulfonate, tris(p-fluorophenyl)sulfonium p-toluenesulfonate, (p-fluorophenyl)diphenylsulfonium trifluoromethanesulfonate, 1-(4-n-buthoxynaphthyl)tetrahydrophenium nonafluoro-2-butanesulfonate, triphenylsulfonium 1,1,2,2-tetrafluoro-2-(tetracyclo[4.4.0.1$^{2,5}$.1$^{7,10}$]dodecane-8-yl) ethanesulfonate, triphenylsulfonium 1,1-difluoro-2-(tetracyclo[4.4.0.1$^{2,5}$.1$^{7,10}$]dodecane-8-yl)ethanesulfonate, 1-(4-n-butoxynaphthyl)tetrahydrophenium 1,1,2,2-tetrafluoro2-(tetracyclo[4.4.0.1$^{2,5}$.1$^{7,10}$]dodecane-8-yl)ethanesulfonate, and 1-(4-n-butoxynaphthyl)tetrahydrophenium 1,1-difluoro-2-(tetracyclo[4.4.0.1$^{2,5}$.1$^{7,10}$]dodecane-8-yl) ethanesulfonate.

(4) Sulfone Compound

As examples of the sulfone compounds, β-ketosulfone, β-sulfonylsulfone, an α-diazo compound of these compounds, and the like can be given.

As specific examples of the sulfone compound, phenacylphenylsulfone, mesitylphenacylsulfone, bis(phenylsulfonyl)methane, 4-trisphenacylsulfone, and the like can be given.

(5) Sulfonate Compounds

As examples of sulfonate compounds, an alkyl sulfonate, a haloalkyl sulfonate, an aryl sulfonate, an imino sulfonate, and the like can be given.

As specific examples of the sulfonate compounds, benzointosylate, pyrogalloltris(trifluoromethanesulfonate), pyrogalloltris(nonafluoro-2-butanesulfonate), pyrogalloltris (methanesulfonate), nitrobenzyl-9,10-diethoxyanthracene-2-sulfonate, α-methylolbenzointosylate, α-methylolbenzoin n-octanesulfonate, α-methylolbenzointrifluoromethanesulfonate, and α-methylolbenzoin n-decanesulfonate can be given.

(6) Diazomethane Compounds

As examples of the diazomethane compounds, compounds shown by the following formula (9) can be given;

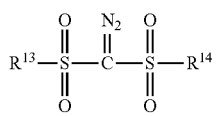

(9)

wherein $R^{13}$ and $R^{14}$ individually represent a monovalent group such as an alkyl group, an aryl group, a haloalkyl group, and a haloaryl group.

As examples of the diazomethane compounds, bis(trifluoromethanesulfonyl)diazomethane, bis(cyclohexanesulfonyl)

diazomethane, bis(benzenesulfonyl)diazomethane, bis(p-toluenesulfonyl)diazomethane, methansulfonyl-p-toluenesulfonyldiazomethane, cyclohexanesulfonyl-1,1-dimethylethylsulfonyldiazomethane, bis(1,1-dimethylethanesulfonyl)diazomethane, bis(3,3-dimethyl-1,5-dioxaspiro[5.5]dodecane-8-sulfonyl)diazomethane, bis(1,4-dioxaspiro[4.5]decane-7-sulfonyl)diazomethane, bis(t-butylsulfonyl)diazomethane, and the like can be given.

Preferable examples of the above acid generators are as follows.

It is preferable to use at least one compound selected from a group consisting of bis(4-t-butylphenyl)iodonium trifluoromethanesulfonate, bis(4-t-butylphenyl)iodonium perfluoro-n-butanesulfonate, bis(4-t-butylphenyl)iodonium p-toluenesulfonate, bis(4-t-butylphenyl)iodonium 10-camphorsulfonate, bis(4-t-butylphenyl)iodonium 2-trifluoromethylbenzenesulfonate, bis(4-t-butylphenyl)iodonium 4-trifluoromethylbenzenesulfonate, bis(4-t-butylphenyl)iodonium 2,4-difluorobenzenesulfonate, triphenylsulfonium trifluoromethanesulfonate, triphenylsulfonium perfluoro-n-butanesulfonate, triphenylsulfonium p-toluenesulfonate, triphenylsulfonium 10-camphorsulfonate, triphenylsulfonium 2-trifluoromethylbenzenesulfonate, triphenylsulfonium 4-trifluoromethylbenzenesulfonate, torphenylsulfonium 2,4-difluoromethylbenzenesulfonate, N-(trifluoromethanesulfonyloxy)succineimide, N-(trifluoromethanesulfonyloxy)bicycle[2.2.1]hept-5-ene-2,3-dicarboxylmide, N-(10-camphorsulfonyloxy)succineimide, N-(camphorsulfonyloxy)bicyclo[2.2.1]hept-5-ene-dicarboxylmide, N-{(5-methyl-5-carboxymethanebicyclo[2,2,1]hept-2-yl)sulfonyloxy}succinimide, bis(4-t-butylphenyl)iodoniumperfluorooctanesulfonate, diphenyliodonium nonafluorobutanesulfonate, diphenyliodonium trifluoromethanesulfonate, diphenyliodonium perfluorooctanesulfonate, diphenyliodonium 10-coaphorsulfonate, triphenylsulfonium perfluorooctanesulfonate, tri(p-methoxyphenyl)sulfonium trifluoromethanesulfonate, tri(p-methoxyphenyl)sulfonium 10-camphorsulfonate, bis(p-fluorophenyl)iodonium trifluoromethanesulfonate, bis(p-fluorophenyl)iodonium nonafluoromethanesulfonate, bis(p-fluorophenyl)iodonium camphorsulfonate, (p-fluorophenyl)(phenyl)iodonium trifluoromethanesulfonate, tris(p-fluorophenyl)sulfonium trifluoromethanesulfonate, tris(p-fluorophenyl)sulfonium p-toluenesulfonate, (p-fluorophenyl)diphenylsulfonium trifluoromethanesulfonate, N-{(5-methyl-5-carboxymethanebicyclo[2,2,1]hept-2-yl)sulfonyloxy}succinimide, N-(nonafluorobutylsulfonyloxy)bicyclo[2.2.1]hept-5-ene-2,3-dicarboxyimide, N-(p-toluenesulfonyloxy)succinimide, N-(benzenesulfonyloxy)bicyclo[2.2.1]hept-5-ene-2,3-dicarboxylmide, bis(cyclohexanesulfonyl)diazomethane, bis(3,3-dimethyl-1,5-dioxaspiro[5.5]dodecane-8-sulfonyl)diazomethane, bis(1,4-dioxaspiro[4.5]decane-7-sulfonyl)diazomethane, bis(t-butylsulfonyl)diazomethane, 1-(4-n-butoxynaphthyl)tetrahydrothiophenium nonafluoro-n-butanesulfonate, triphenylsulfonium 1,1,2,2-tetrafluoro-2-(tetracyclo[4.4.0.1$^{2,5}$.1$^{7,10}$]dodecan-8-yl)ethanesulfonate, triphenylsulfonium 1,1-difluoro-2-(tetracyclo[4.4.0.1$^{2,5}$.1$^{7,10}$]dodecan-8-yl)ethanesulfonate, 1-(4-n-buthoxynaphthyl)tetrahydrothiophenium 1,1,2,2-tetrafluoro-2-(tetracyclo[4.4.0.1$^{2,5}$.1$^{7,10}$]dodecan-8-yl)ethanesulfonate, and 1-(4-n-buthoxynaphthyl)tetrahydrothiophenium 1,1-difluoro-2-(tetracyclo[4.4.0.1$^{2,5}$.1$^{7,10}$]dodecan-8-yl)ethanesulfonate.

As examples of the acids, carboxylic acids and sulfonic acids can be given.

Examples of the carboxylic acids and sulfonic acids are as follows.

Examples of the low molecular compounds such as carboxylic acids and sulfonic acids include:

formic acid, acetic acid, propionic acid, butanoic acid, pentanoic acid, hexanoic acid, heptanoic acid, octanoic acid, nonanoic acid, decanoic acid, undecanoic acid, lauryl acid, tridecane acid, myristic acid, pentadecanoic acid, palmitic acid, heptadecanoic acid, stearic acid, 2-methylpropanoic acid, 2-ethylbutanoic acid, 2-methylbutanoic acid, 3-methylbutanoic acid, 2,2-dimethylbutanoic acid, tert-butylacetic acid, (±)-2-methylpentanoic acid, 2-propylpentanoic acid, 3-methylpentanoic acid, 4-methylpentanoic acid, 2-methylhexanoic acid, (±)-2-ethylhexanoic acid, 2-methylheptanoic acid, 4-methyloctanoic acid, oxalic acid, malonic acid, methylmalonic acid, ethylmalonic acid, butylmalonic acid, dimethylmalonic acid, succinic acid, methylbutanedioic acid, 2,2-dimethylbutanedioic acid, 2-ethyl-2-methylbutanedioic acid, 2,3-dimethylbutanedioic acid, glutaric acid, 2-methylglutaric acid, 3-methylglutaric acid, 2,3-dimethylglutaric acid, 2,4-dimethylglutaric acid, 3,3-dimethylglutaric acid, adipic acid, 3-methyladipic acid, 2,2,5,5-tetramethyladipic acid, pimelic acid, suberic acid, azelaic acid, sebacic acid, 1,11-undecanedicarboxylic acid, undecanedioic acid, 1,12-dodecanedicarboxylic acid, hexadecanedioic acid, 1,2,3-propanetricarboxylic acid, 2-methyl-1,2,3-propanetricarboxylic acid, 1,2,3,4-butanetetracarboxylic acid, difluoroacetic acid, trifluoroacetic acid, pentafluoropropanoic acid, heptafluorobutanoic acid, hexafluoroglutaric acid, glycolic acid, 2-hydroxyisobutanoic acid, 2-hydroxy-2-methylbutanoic acid, 2-ethyl-2-hydroxybutanoic acid, (±)-2-hydroxy-3-methylbutanoic acid, (±)-2-hydroxy-4-methylpentanoic acid, (±)-2-hydroxyhexanoic acid, 10-hydroxydecanoic acid, 12-hydroxydodecanoic acid, 12-hydroxystearic acid, D-marinic acid, (R)-(−)-citramarinic acid, (±)-2-isopropylmarinic acid, 3-hydroxy-3-methylglutaric acid, D-tartaric acid, L-tartaric acid, citric acid, (1R,3R,4R,5R)-(−)-quinic acid, methoxyacetic acid, ethoxyacetic acid, 3-methoxypropionic acid, (−)-menthoxyacetic acid, (±)-tetrahydro-2-fronic acid, (±)-tetrahydro-3-fronic acid, thiolacetic acid, thiopivalic acid, 2-mercaptopropionic acid, 3-mercaptopropionic acid, mercaptobutanedioic acid, (methylthio)acetatic acid, thiodiglycolic acid, 3,3'-dithiodipropionic acid, 3-carboxypropyldisulfuric acid, (±)-2-(carboxymethylthio)butanedioic acid, 2,2',2'',2'''-[1,2-ethanediylidenetetrakis(thio)]tetrakisacetic acid, (±)-3-methyl 2-oxopentanoic acid, 5-oxohexanoic acid, 6-oxoheptanoic acid, 4,6-dioxoheptanoic acid, 2-oxopentanedionic acid, 2-oxohexanedionic acid, 2-oxoheptanedionic acid, 2-oxononanedionic acid, cis-pinoic acid, cyclobutanecarboxylic acid, cyclopentanecarboxylic acid, cyclopentylacetic acid, 3-cyclopentylpropionic acid, cyclohexylacetic acid, dicyclohexylacetic acid, cyclohexanepropionic acid, cyclohexanebutanoic acid, cyclohexanepentanoic acid, 1-methyl-1-cyclohexanecarboxylic acid, (±)-2-methyl-1-cyclohexanecarboxylic acid, (±)-3-methyl-1-cyclohexanecarboxylic acid, 4-methyl-cyclohexanecarboxylic acid, 4-tert-butylcyclohexanecarboxylic acid, trans-4-pentylcyclohexanecarboxylic acid, 4-methyl-cyclohexaneacetic acid, (R)-(−)-hexahydromandelic acid, (S)-(+)-hexahydromandelic acid, 3-methoxycyclohexanecarboxylic acid, 4-methoxycyclohexanecarboxylic acid, cycloheptanecarboxylic acid, 2-norbornaneacetatic acid, [1R-(2-endo,3-exo)]-3-hydroxy-4,7,7-trimethylbicyclo[2.2.1]heptane-2-acetic acid, (+)-camphorcarboxylic acid, (−)-camphorcarboxylic acid, cis-bicyclo[3.3.0]octane-2-carboxylic acid, anti-3-oxotricyclo[2.2.1.0$^{2,6}$]heptane-7-carboxylic acid, 3-adamantanecarboxylic acid, 1-adamantanecarboxylic acid, 1-adamantaneacetic acid, 3-methyl-1-adamantaneacetic acid, trans-DL-1,2-cyclopentanedicarboxylic acid, 1,1- cyclopentanediacetic acid, (1S,3R)-(−)-camphoric acid, 1,1-cyclohexanediacetatic acid, (±)-trans-1,2-cyclohexanedicarboxylic acid, (±)-1,3-cyclohexanedicarboxylic acid, 1,4-cyclohexanedicarboxylic acid, 1,3-adamantanedicarboxylic acid, 1,3,5-cyclohexanetricarboxylic acid, (1α,3α,5α)-1,3,5-trimethyl-1,3,5-cyclohexanetricarboxylic acid, (1α,3α,5β)-1,3,5-trimethyl-1,3,5-cyclohexanetricarboxylic acid, 1,2,3,4-cyclobutanetetracarboxylic acid, cis,cis,cis,cis-1,2,3,4-cyclopentanetetracarboxylic acid, 1,2,3,4,5,6-cyclohexanehexacarboxylic acid, benzoic acid, phenylacetic acid, 1-phenyl-1-cyclopentanecarboxylic acid, α-cyclohexylphenylacetic acid, diphenylacetic acid, triphenylacetatic acid, 2-phenylpropionic acid, 3-phenylpropionic acid, 2-benzyl3,3-dimethylbutanoic acid, 2,2-diphenylpropionic acid, 3,3-diphenylpropionic acid, 3,3,3-triphenylpropionic acid, 2-phenylbutanoic acid, 2-ethyl-2-phenylbutanoic acid, 3-phenylbutanoic acid, 4-phenylbutanoic acid, 5-phenylpentanoic acid, 3-methyl-2-phenylpentanoic acid, 6-phenylhexanoic acid, α-fluorophenylacetic acid, (R)-(−)-α-methoxyphenylacetic acid, phenoxyacetic acid, 3-phenoxypropionic acid, (±)-2-phenoxypropionic acid, 11-phenoxyundecanoic acid, 2-phenoxybutanoic acid, (±)-mandelic acid, (±)-α-methoxyphenylacetic acid, 2-hydroxy-3-phenylpropionic acid, tropinic acid, thiophenoxyacetic acid, S-benzylthioglycolic acid, 2-ethylthio-2,2-diphenylacetic acid, benzoylformic acid, phenylpyruvic acid, 3-benzoylpropionic acid, 4-benzoylbutanoic acid, phenylmalonic acid, benzylmalonic acid, phenylbutanedioic acid, 3-phenylpentanedioic acid, o-tolylacetic acid, 1,2-phenylenediacetic acid, (±)-1-benzcyclobutenecarboxylic acid, 1,2,3,4-tetrahydro-2-naphthoic acid, (α,α,α-trifluoro-o-tolyl)acetic acid, 2-fluorophenylacetic acid, 2-chlorophenylacetic acid, 2-bromophenylacetic acid, (±)-2-(2-chlorophenoxy)propionic acid, 2-methoxyphenylacetic acid, (±)-2-methoxymandelic acid, 3-(2-methoxyphenyl)propionic acid, 1,2-phenyleneoxydiacetic acid, 2-hydroxyphenylacetic acid, 2-nitrophenylacetic acid, 3-(2-nitrophenyl)-2-oxopropanoic acid, 2-formylphenoxyacetic acid, homophthalic acid, m-tolylacetic acid, (α,α,α-trifluoro-m-tolyl)acetic acid, 3-hydroxyphenylacetic acid, 3-methoxyphenylacetic acid, 3-methoxymandelic acid, 3-nitrophenylacetic acid, p-tolylacetic acid, (4-methylphenoxy)acetic acid, 3-fluorophenylacetic acid, 4-isobutyl-α-methylphenyl acetic acid, 4-(4-chloro-o-tolyloxy)butanoic acid, 1,4-phenylenediacetic acid, 4-fluorophenylacetic acid, (α,α,α-trifluoro-p-tolyl)acetic acid, 4-(trifluoromethyl)mandelic acid, 3-(4-fluorobenzoyl)propionic acid, 4-chlorophenylacetic acid, 4-bromophenylacetic acid, 3,3,3-tris(4-chlorophenyl)propionic acid, 4-(bromomethyl)phenylacetic acid, 1-(4-chlorophenyl)-1-cyclopentanecarboxylic acid, 3-(4-chlorobenzoyl)propionic acid, 1-(4-methoxyphenyl)cyclopentanecarboxylic acid, 1-(4-methoxyphenyl)cyclohexanecarboxylic acid, 4-methoxyphenylacetic acid, 4-ethoxyphenylacetic acid, 3-(4-methoxyphenyl)propionic acid, 4-(4-methoxyphenyl)butanoic acid, 4-hydroxyphenylacetic acid, 2-(4-hydroxyphenoxy)propionic acid, 3-(4-hydroxyphenyl)propionic acid, (±)-4-methoxymandelic acid, 4-chlorophenoxyacetic acid, bis(4-chlorophenoxy)acetic acid, 4,4-bis(4-hydroxyphenyl)pentanoic acid, 4-bromomandelic acid, 4-(dimethylamino)phenylacetic acid, 4-nitrophenylacetic acid, 2-(4-nitrophenyl)propionic acid, 4-(4-nitrophenyl)butanoic acid, 3-(4-methoxybenzoyl)propionic acid, 4-hydroxyphenylpyruvic acid, D-3-phenyllactic acid, 4-fluorophenoxyacetic acid, (±)-2-(4-chlorophenoxy)propionic acid, 2-(4-chlorophenoxy)-2-methylpropionic acid, 9,10-dihydro-2-phenanthrenebutanoic acid, 9,10-dihydro-γ-oxo-2-phenanthrenebutanoic acid, (2,4-di-tert-pentylphenoxy)acetic acid, 2,6-difluorophenylacetic acid, 2,4-difluorophenylacetic acid, 2,5-difluorophenylacetic acid, 3,4-difluorophenylacetic acid, 3,5-difluorophenylacetic acid, 4-chloro-o-tolyloxyacetic acid, 3,5-bis(trifluoromethyl)phenylacetic acid, (3,4-dimethoxyphenyl)acetic acid, 3,4-(methylenedioxy)phenylacetic acid, 3-fluoro-4-hydroxyphenylacetic acid, 5-methoxy-1-indanone-3-acetic acid, 3-(3,4-dimethoxyphenyl)propionic acid, 4-(3,4-dimethoxyphenyl)butanoic acid, (2,5-dimethoxyphenyl)acetic acid, (4-hydroxy-3-methoxyphenyl)acetic acid, (±)-4-hydroxy-3-methoxymandelic acid, (±)-3-hydroxy-4-methoxymandelic acid, DL-3,4-dihydroxymandelic acid, 2,5-dihydroxyphenylacetic acid, 3,4-dihydroxyphenylacetic acid, 3,4-dihydroxyhydrocinnamic acid, 4-hydroxy-3-nitrophenylacetic acid, podocarpic acid, 2,5-dihydroxy-1,4-benzenediacetic acid, 3,4,5-trimethoxyphenylacetic acid, 3-(3,4,5-trimethoxyphenyl)propionic acid, 2,3,4,5,6-pentafluorophenylacetic acid, 4-biphenylacetic acid, 1-naphthylacetic acid, 2-naphthylacetic acid, (±)-α-trityl-2-naphthalenepropionic acid, (1-naphthoxy)acetic acid, (2-naphthoxy)acetic acid, (+)-6-methoxy-α-methyl-2-naphthaleneacetic acid, 9-fluoreneacetic acid, 2-methylbenzoic acid, 2-fluorobenzoic acid, 2-trifluoromethylbenzoic acid, 2-methoxybenzoic acid, 2-ethoxybenzoic acid, salicylic acid, thiosalicylic acid, 2-nitrobenzoic acid, 2-(p-toluoyl)benzoic acid, 3-methylbenzoic acid, 3-fluorobenzoic acid, 3-trifluoromethylbenzoic acid, 3-methoxybenzoic acid, 3-hydroxybenzoic acid, 3-dimethylaminobenzoic acid, 3-nitrobenzoic acid, 4-methylbenzoic acid, 4-ethylbenzoic acid, 4-propylbenzoic acid, 4-isopropylbenzoic acid, 4-butylbenzoic acid, 4-tert-butylbenzoic acid, 4-pentylbenzoic acid, 4-hexylbenzoic acid, 4-heptylbenzoic acid, 4-octylbenzoic acid, 4-fluorobenzoic acid, 4-trifluoromethylbenzoic acid, 4,4'-(hexafluoroisopropylidene)bis(benzoic acid), 4,4'-oxybis(benzoic acid), 4-methoxybenzoic acid, 4-(trifluoromethoxy)benzoic acid, 4-ethoxybenzoic acid, 4-propoxybenzoic acid, 4-pentyloxybenzoic acid, 4-hexyloxybenzoic acid, 4-heptyloxybenzoic acid, 4-octyloxybenzoic acid, 4-nonyloxybenzoic acid, 4-decyloxybenzoic acid, 4-undecyloxybenzoic acid, 4-dodecyloxybenzoic acid, 4-iso-propoxybenzoic acid, 4-hydroxybenzoic acid, 4-(methylthio)benzoic acid, 4-(ethylthio)benzoic acid, 4-dimethylaminobenzoic acid, 4-(diethylamino)benzoic acid, 4-nitrobenzoic acid, 4-acetylbenzoic acid, 4-carboxybenzaldehyde, phthalic acid, isophthalic acid, 1,2,3-benzenetricarboxylic acid, terephthalic acid, 1,2,4-benzenetricarboxylic acid, 1,3,5-benzenetricarboxylic acid, 1,2,4,5-benzenetetracarboxylic acid, benzenehexacarboxylic acid, 2,3-dimethylbenzoic acid, 2,6-dimethylbenzoic acid, 3-fluoro-2-methylbenzoic acid, 2,3-difluorobenzoic acid, 2,6-difluorobenzoic acid, 2-fluoro-6-trifluoromethylbenzoic acid, 2-fluoro-3-trifluoromethylbenzoic acid, 2,6-bis(trifluoromethyl)benzoic acid, 2,3-dimethoxybenzoic acid, 2,6-dimethoxybenzoic acid, 3-methylsalicylic acid, 3-isopropylsalicylic acid, 3-methoxysalicylic acid, 3-hydroxysalicylic acid, 6-hydroxysalicylic acid, 2-methyl-6-nitrobenzoic acid, 3-methyl-2-nitrobenzoic acid, 2-methyl-3-nitrobenzoic acid, 3-methoxy-2-nitrobenzoic acid, 3-nitrophthalic acid, 2,4-dimethylbenzoic acid, 2,5-dimethylbenzoic acid, 5-fluoro-2-methylbenzoic acid, 3-fluoro-4-methylbenzoic acid, 2,4-bis(trifluoromethyl)benzoic acid, 2,5-bis(trifluoromethyl)benzoic acid, 2,4-difluorobenzoic acid, 3,4-difluorobenzoic acid, 2-fluoro-4-trifluoromethylbenzoic acid, 2,5-difluorobenzoic acid, 3-methoxy-4-methylbenzoic acid, 3-fluoro-4-methoxybenzoic acid, 2,4-dimethoxybenzoic acid, 2,5-dimethoxybenzoic acid, 3,4-dimethoxybenzoic acid, 3,4-diethoxybenzoic acid, piperonylic acid, 3-hydroxy-4-methylbenzoic acid, 4-methylsalicylic acid, 5-methylsalicylic acid, 5-fluorosalicylic acid, 2-methoxy-4-(methylthio)benzoic acid, 5-methoxysalicylic acid, 4-methoxysalicylic acid, 4-hydroxy-3-methoxybenzoic acid, 3-hydroxy-4-methoxybenzoic acid, 3,4-dihydroxybenzoic acid, 2,5-dihydroxybenzoic acid, 2,4-dihydroxybenzoic acid, 4-diethylaminosalicylic acid, 5-methyl-2-nitrobenzoic acid, 4-methyl-3-nitrobenzoic acid, 3-methyl-4-nitrobenzoic acid, 2-methyl-5-nitrobenzoic acid, 2-fluoro-5-nitrobenzoic acid, 4-fluoro-3-nitrobenzoic acid, 4-methoxy-3-nitrobenzoic acid, 3-methoxy-4-nitrobenzoic acid, 3-hydroxy-4-nitrobenzoic acid, 2-hydroxy-5-nitrobenzoic acid, 2,4-dinitrobenzoic acid, 3,4-dinitrobenzoic acid, 4-methylphthalic acid, 4-hydroxyisophthalic acid, 4-nitrophthalic acid, nitroterephthalic acid, 1,4-pehnylenedipropionic acid, 3,5-dimethylbenzoic acid, 3,5-di-tert-butylbenzoic acid, 3,5-difluorobenzoic acid, 3,5-bis(trifluoromethyl)benzoic acid, 3,5-dimethoxybenzoic acid, 3,5-dihydroxybenzoic acid, 3,5-dinitrobenzoic acid, 5-tert-butylisophthalic acid, 5-nitroisophthalic acid, 5-(4-carboxy-2-nitrophenoxy)isophthalic acid, 2,3,4-trifluorobenzoic acid, 2,3,6-trifluorobenzoic acid, 2,4,6-trimethylbenzoic acid, 2,4,6-trifluorobenzoic acid, 3,4,5-trifluorobenzoic acid, 3,4,5-trimethoxybenzoic acid, 3,4,5-triethoxybenzoic acid, 2-hydroxy-3-isopropyl-6-methylbenzoic acid, 2-hydroxy-6-isopropyl-3-methylbenzoic acid, 3,5-diisopropylsalicylic acid, 3,5-di-tert-butyl-4-hydroxybenzoic acid, 2,3,4-trihydroxybenzoic acid, 3,4,5-trihydroxybenzoic acid, 3-hydroxy-4,5-dimethoxybenzoic acid, 4-hydroxy-3,5-dimethoxybenzoic acid, 4,5-dimethoxy-2-nitrobenzoic acid, 4-methyl-3,5-dinitrobenzoic acid, 4-hydroxy-3,5-dinitrobenzoic acid, 3,5-dinitrosalicylic acid, 3-hydroxy-4-methyl-2-nitrobenzoic acid, 2,3,4-trimethoxybenzoic acid, 2,4,5-trifluorobenzoic acid, 2,4,5-trimethoxybenzoic acid, 2,5-dihydroxyterephthalic acid, 2,3,4,5-tetrafluorobenzoic acid, 2,3,5,6-tetrafluorobenzoic acid, 2,3,5,6-tetrafluoro-4-methylbenzoic acid, pentafluorobenzoic acid, tetrafluoroterephthalic acid, tetrafluoroisophthalic acid, tetrafluorophthalic acid, 2-biphenylcarboxylic acid, 4'-hydroxy-4-biphenylcarboxylic acid, 4,4'-biphenyldicarboxylic acid, 2-benzylbenzoic acid, 2-bibenzylcarboxylic acid, 2,3,4,5,6-pentafluorophenoxyacetic acid, 2-phenoxybenzoic acid, 3-phenoxybenzoic acid, 4-phenoxybenzoic acid, 2-benzoylbenzoic acid, 3-benzoylbenzoic acid, 4-benzoylbenzoic acid, 2-(4-fluorobenzoyl)benzoic acid, 4-[4-(2-carboxybenzoyl)phenyl]butanoic acid, 1-naphthalenecarboxylic acid, 2-naphthalenecarboxylic acid, 4-fluoro-1-naphthalenecarboxylic acid, 1-hydroxy-2-naphthalenecarboxylic acid, 2-hydroxy-1-naphthalenecarboxylic acid, 3-hydroxy-2-naphthalenecarboxylic acid, 2-ethoxy-1-naphthalenecarboxylic acid, 1,4-dihydroxy-2-naphthalenecarboxylic acid, 3,5-dihydroxy-2-naphthalenecarboxylic acid, 1,4-naphthalenedicarboxylic acid, 2,3-naphthalenedicarboxylic acid, 2,6-naphthalenedicarboxylic acid, 1-(8-carboxy)naphthaldehyde, 2-biphenylenecarboxylic acid, 9-fluorenecarboxylic acid, 1-fluorenecarboxylic acid, 4-fluorenecarboxylic acid, 9-hydroxy-1-fluorenecarboxylic acid, 9-hydroxy-9-fluorenecarboxylic acid, 9-fluorene-1-carboxylic acid, 9-fluorene-2-carboxylic acid, 9-fluorene-4-carboxylic acid, 7-nitro-9-oxo-4-fluorenecarboxylic acid, 9-anthracenecarboxylic acid, 9,10-anthracenedipropionic acid, xanthene-9-carboxylic acid, 2,7-di-tert-butyl-9,9-dimethyl-4,5-xanthenedicarboxylic acid, 2,2'-(ethylenedioxy)dianiline-N,N,N',N'-tetraacetic acid, N-carbobenzyloxy-2-methylalanine, N-(4-nitrobenzoyl)-β-alanine, N-acetyl-2-fluoro-DL-phenylalanine, N-acetyl-3-fluoro-DL-phenylalanine, N-acetyl-4-fluoro-DL-phenylalanine, methanesulfonic acid, ethanesulfonic acid, taurine, 3-[(1,1-dimethyl-2-hydroxyethyl)amino]-2-hydroxy-1-propanesulfonic acid, 3-[bis(2-hydroxyethyl)amino]-2-hydroxy-1-propanesulfonic acid, (1R)-(−)-10-camphorsulfonic acid, (1S)-(+)-10-camphorsulfonic acid, trifluoromethylsulfonic acid, perfluorobutanesulfonic acid, perfluorooctanesulfonic acid, (methylamino)sulfonic acid, (butylamino)sulfonic acid, 1,1,2,2-tetrafluoro-2-(tetracyclo[4.4.0.1$^{2,5}$.1$^{7,10}$]dodecan-8-yl)ethanesulfonic acid, and 1,1-difluoro-2-(tetracyclo[4.4.0.1$^{2,5}$.1$^{7,10}$]dodecan-8-yl)ethanesulfonic acid.

Preferable acids among the above carboxylic acids and sulfonic acids are given below.

Acetic acid, propionic acid, butanoic acid, pentanoic acid, hexanoic acid, heptanoic acid, octanoic acid, nonanoic acid, decanoic acid, undecanoic acid, lauryicl acid, tridecanic acid, myristic acid, pentadecanoic acid, palmitic acid, heptadecanoic acid, stearic acid, 2-methylpropane acid, 2-ethylbutanoic acid, 2-methylbutanoic acid, 3-methylbutanoic acid, 2,2-dimethylbutanoic acid, tert-butylacetic acid, (±)-2-methylpentanoic acid, 2-propylpentanoic acid, 3-methylpentanoic acid, 4-methylpentanoic acid, 2-methylhexanoic acid, (±)-2-ethylhexanoic acid, 2-methylheptanoic acid, 4-methyloctanoic acid, oxalic acid, malonic acid, methylmalonic acid, ethylmalonic acid, butylmalonic acid, dimethylmalonic acid, succinic acid, methylbutanedioic acid, 2,2-dimethylbutanedioic acid, 2-ethyl-2-methylbutanedioic acid, 2,3-dimethylbutanedioic acid, glutaric acid, 2-methylglutaric acid, 3-methylglutaric acid, 2,3-dimethylglutaric acid, 2,4-dimethylglutaric acid, 3,3-dimethylglutaric acid, adipic acid, 3-methyladipic acid, 2,2,5,5-tetramethyladipic acid, pimelic acid, suberic acid, azelaic acid, sebacic acid, 1,11-undecanedicarboxylic acid, undecanedioic acid, 1,12-dodecanedicarboxylic acid, hexadecanedioic acid, 1,2,3-propanetricarboxylic acid, 2-methyl-1,2,3-propanetricarboxylic acid, 1,2,3,4-butanetetracarboxylic acid, difluoroacetic acid, trifluoroacetic acid, pentafluoropropanoic acid, heptafluorobutanoic acid, hexafluoroglutaric acid, 10-hydroxydecanoic acid, 12-hydroxydodecanoic acid, 12-hydroxystearic acid, citric acid, (−)-menthoxyacetic acid, thiolacetic acid, thiopivalic acid, (methylthio)acetic acid, thiodiglycolic acid, (±)-2-(carboxymethylthio)butanedioic acid, 2,2',2'',2'''-[1,2-ethanediylidenetetrakis(thio)]tetrakisacetic acid, (±)-3-methyl-2-oxopentanoic acid, 5-oxohexanoic acid, 6-oxoheptanoic acid, 2-oxopentanedioic acid, 2-oxohexanedioic acid, 4-oxoheptanedioic acid, 5-oxononanedioic acid, cyclopentanecarboxylic acid, cyclopentylacetic acid, 3-cyclopentylpropionic acid, cyclohexylacetic acid, dicyclohexylacetic acid, cyclohexanepropionic acid, cyclohexanebutanoic acid, cyclohexanepentanoic acid, (±)-2-methyl-1-cyclohexanecarboxylic acid, (±)-3-methyl-1-cyclohexanecarboxylic acid, 4-methylcyclohexanecarboxylic acid, 4-tert-butylcyclohexane carboxylic acid, trans-4-pentylcyclohexane carboxylic acid, 4-methylcyclohexanacetic acid, 3-methoxycyclohexanecarboxylic acid, 4-methoxycyclohexanecarboxylic acid, cycloheptanecarboxylic acid, 2-norbornaneacetic acid, [1R-(2-endo,3-exo)]-3-hydroxy-4,7,7-trimethylbicyclo[2.2.1]heptane-2-acetic acid, (+)-camphorcarboxylic acid, (−)-camphorcarboxylic acid, cis-bicyclo[3.3.0]octane-2-carboxylic acid, anti-3-oxotricyclo[2.2.1.0$^{2,6}$]heptane-7-carboxylic acid, 3-adamantanecarboxylic acid, 1-adamantanecarboxylic acid, 1-adamantane acetic acid, 3-methyl1-adamantane acetic acid, trans-DL-1,2-cyclopentanedicarboxylic acid, 1,1-cyclopentanediacetic acid, (1S,3R)-(−)-camphoric acid, (±)-trans-1,2-cyclohexanedicarboxylic acid, (±)-1,3-cyclohexanedicarboxylic acid, 1,4-cyclohexanedicarboxylic acid, 1,3-adamantanedicarboxylic acid, 1,3,5-cyclohexanetricarboxylic acid, (1α,3α,5α)-1,3,5-trimethyl-1,3,5-cyclohexanetricarboxylic acid, (1α,3α,5β)-

1,3,5-trimethyl-1,3,5-cyclohexanetricarboxylic acid, cis,cis, cis,cis-1,2,3,4-cyclopentanetetracarboxylic acid, 1,2,3,4,5,6-cyclohexanehexacarboxylic acid, benzoic acid, phenylacetic acid, 2-phenylpropionic acid, 3-phenylpropionic acid, α-fluorophenylacetic acid, 3-phenoxypropionic acid, (±)-2-phenoxypropionic acid, (±)-α-methoxyphenylacetic acid, o-tolylacetic acid, 1,2-phenylenediacetic acid, 1,2,3,4-tetrahydro-2-naphthoic acid, (α,α,α-trifluoro-o-tolyl)acetic acid, 2-fluorophenylacetic acid, 2-methoxyphenylacetic acid, 2-nitrophenylacetic acid, 3-(2-nitrophenyl)-2-oxopropanoic acid, (α,α,α-trifluoro-m-tolyl)acetic acid, 3-nitrophenylacetic acid, 3-fluorophenylacetic acid, 4-fluorophenylacetic acid, (α,α,α-trifluoro-p-tolyl)acetic acid, 4-nitrophenylacetic acid, 4-fluorophenoxyacetic acid, 2,6-difluorophenylacetic acid, 2,4-difluorophenylacetic acid, 2,5-difluorophenylacetic acid, 3,4-difluorophenylacetic acid, 3,5-difluorophenylacetic acid, 3,5-bis(trifluoromethyl)phenylacetic acid, 3-fluoro-4-hydroxyphenylacetic acid, (2,5-dimethoxyphenyl)acetic acid, 4-hydroxy-3-nitrophenylacetic acid, 2,3,4,5,6-pentafluorophenylacetic acid, 1-naphthylacetic acid, 2-naphthylacetic acid, (1-naphthoxy)acetic acid, (2-naphthoxy)acetic acid, 2-fluorobenzoic acid, 2-trifluoromethylbenzoic acid, 2-nitrobenzoic acid, 3-fluorobenzoic acid, 3-trifluoromethylbenzoic acid, 3-methoxybenzoic acid, 4-fluorobenzoic acid, 4-trifluoromethylbenzoic acid, 4-nitrobenzoic acid, 3-fluoro-2-methylbenzoic acid, 2,3-difluorobenzoic acid, 2,6-difluorobenzoic acid, 2-fluoro-6-trifluoromethylbenzoic acid, 2-fluoro-3-trifluoromethylbenzoic acid, 2,6-bis(trifluoromethyl)benzoic acid, 2-methyl-6-nitrobenzoic acid, 3-methyl-2-nitrobenzoic acid, 2-methyl-3-nitrobenzoic acid, 5-fluoro-2-methylbenzoic acid, 3-fluoro-4-methylbenzoic acid, 2,4-bis(trifluoromethyl)benzoic acid, 2,5-bis(trifluoromethyl)benzoic acid, 2,4-difluorobenzoic acid, 3,4-difluorobenzoic acid, 2-fluoro-4-trifluoromethylbenzoic acid, 2,5-difluorobenzoic acid, 3-fluoro-4-methoxybenzoic acid, 5-methyl-2-nitrobenzoic acid, 4-methyl-3-nitrobenzoic acid, 3-methyl-4-nitrobenzoic acid, 2-methyl-5-nitrobenzoic acid, 2-fluoro-5-nitrobenzoic acid, 4-fluoro-3-nitrobenzoic acid, 4-methoxy-3-nitrobenzoic acid, 3-methoxy-4-nitrobenzoic acid, 3-hydroxy-4-nitrobenzoic acid, 2-hydroxy-5-nitrobenzoic acid, 2,4-dinitrobenzoic acid, 3,4-dinitrobenzoic acid, 3,5-difluorobenzoic acid, 3,5-bis(trifluoromethyl)benzoic acid, 3,5-dinitrobenzoic acid, 2,3,4-trifluorobenzoic acid, 2,3,6-trifluorobenzoic acid, 2,4,6-trifluorobenzoic acid, 3,4,5-trifluorobenzoic acid, 4-methyl-3,5-dinitrobenzoic acid, 4-hydroxy-3,5-dinitrobenzoic acid, 3,5-dinitrosalicylic acid, 2,4,5-trifluorobenzoic acid, 2,34,5-tetrafluorobenzoic acid, 2,3,5,6-tetrafluorobenzoic acid, 2,3,5,6-tetrafluoro-4-methylbenzoic acid, pentafluorobenzoic acid, 2,3,4,5,6-pentafluorophenoxyacetic acid, 1-naphthalenecarboxylic acid, 2-naphthalenecarboxylic acid, 4-fluoro-1-naphthalenecarboxylic acid, 1-hydroxy-2-naphthalenecarboxylic acid, 2-hydroxy-1-naphthalenecarboxylic acid, 3-hydroxy-2-naphthalenecarboxylic acid, 1,4-dihydroxy-2-naphthalenecarboxylic acid, 3,5-dihydroxy-2-naphthalenecarboxylic acid, 1,4-naphthalenedicarboxylic acid, 2,3-naphthalenedicarboxylic acid, 2,6-naphthalenedicarboxylic acid, methanesulfonic acid, ethanesulfonic acid, taurine, 3-[(1,1-dimethyl-2-hydroxyethyl)amino]-2-hydroxy-1-propanesulfonic acid, 3-[bis(2-hydroxyethyl)amino]-2-hydroxy-1-propanesulfonic acid, (1R)-(−)-10-camphorsulfonic acid, (1S)-(+)-10-camphorsulfonic acid, trifluoromethylsulfonic acid, perfluorobutanesulfonic acid, perfluorooctanesulfonic acid, (methylamino)sulfonic acid, (butylamino)sulfonic acid, 1,1,2,2-tetrafluoro-2-(tetracyclo[4.4.0.1$^{2,5}$.1$^{7,10}$]dodecan-8-yl)ethanesulfonic acid, and 1,1-difluoro-2-(tetracyclo[4.4.0.1$^{2,5}$.1$^{7,10}$]dodecan-8-yl)ethane sulfonic acid. At least one acid selected from these acids is preferably used.

These acid generators and acids may be used either individually or in combination of two or more.

The amount of the acid generator or the acid to be added is usually 10 parts by weight or less, preferably 0.001 to 5 parts by weigh, and still more preferably 0.005 to 3 parts by weight for 100 parts by weight of the resin. If the amount of the acid generator or the acid exceeds 10 parts by weight, there is a tendency that the lens of a projection aligner is polluted by the component eluted from the upper layer-forming composition.

In addition, an acid diffusion controller may be added to the upper layer-forming composition for immersion lithography of the embodiment in order to increase lithography performance of the resist.

As examples of such acid diffusion controllers, a compound shown by the following formula (10) (hereinafter called "nitrogen-containing compound (I)"), diamino compounds having two nitrogen atoms in a molecule (hereinafter referred to as "nitrogen-containing compound (II)"), diamino polymers having three or more nitrogen atoms in a molecule (hereinafter referred to as "nitrogen-containing compounds (III)"), amide group-containing compounds, urea compounds, and other nitrogen-containing heterocyclic compounds can be given.

(10)

wherein $R^{15}$s, which may be either the same or different, represent a hydrogen atom, an alkyl group, an aryl group, or an aralkyl group (including the groups in which the hydrogen atom in the alkyl group, the aryl group, or the aralkyl group is replaced by a functional group such as a hydroxyl group, for example).

As examples of the nitrogen-containing compound (I), monoalkylamines such as n-hexylamine, n-heptylamine, n-octylamine, n-nonylamine, and n-decylamine; dialkylamines such as di-n-butylamine, di-n-pentylamine, di-n-hexylamine, di-n-heptylamine, di-n-octylamine, di-n-nonylamine, and di-n-decylamine; trialkylamines such as triethylamine, tri-n-propylamine, tri-n-butylamine, tri-n-pentylamine, tri-n-hexylamine, tri-n-heptylamine, tri-n-octylamine, tri-n-nonylamine, and tri-n-decylamine; aromatic amines such as aniline, N-methylaniline, N,N-dimethylaniline, 2-methylaniline, 3-methylaniline, 4-methylaniline, 4-nitroaniline, diphenylamine, triphenylamine, and 1-naphthylamine can be given.

As examples of the nitrogen-containing compound (II), ethylenediamine, N,N,N',N'-tetramethylethylenediamine, N,N,N',N'-tetrakis(2-hydroxypropyl)ethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, and the like can be given.

As examples of the nitrogen-containing compound (III), polyethyleneimine, polyallylamine, a polymer of dimethylaminoethylacrylamide, and the like can be given.

As examples of the amide group-containing compound, formamide, N-methylformamide, N,N-dimethylformamide, acetamide, N-methylacetamide, N,N-dimethylacetamide, propionamide, benzamide, pyrrolidone, N-methylpyrrolidone, and the like can be given.

Examples of the urea compound include urea, methylurea, 1,1-dimethylurea, 1,3-dimethylurea, 1,1,3,3-tetramethylurea, 1,3-diphenylurea, tributylthiourea, and the like.

As examples of the nitrogen-containing heterocyclic compound, imidazoleses such as imidazole, benzimidazole, 4-methylimidazole, 4-methyl-2-phenylimidazole, and 2-phenylbenzimidazole; pyridines such as pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinamide, quinoline, 8-oxyquinoline, and acridine; pyrazine, pyrazole, pyridazine, quinoxaline, purine, pyrrolidine, piperidine, morpholine, 4-methylmorpholine, piperazine, 1,4-dimethylpiperazine, 1,4-diazabicyclo[2.2.2]octane, and the like can be given.

A base precursor having an acid-dissociable group can also be used as an acid diffusion controller. As specific examples, N-(t-butoxycarbonyl)piperidine, N-(t-butoxycarbonyl)imidazole, N-(t-butoxycarbonyl)benzimidazole, N-(t-butoxycarbonyl)-2-phenylbenzimidazole, N-(t-butoxycarbonyl)dioctylamine, N-(t-butoxycarbonyl)diethanolamine, N-(t-butoxycarbonyl)dicyclohexylamine, N-(t-butoxycarbonyl)diphenylamine, and the like can be given.

Of these nitrogen-containing organic compounds, the nitrogen-containing compound (I) and the nitrogen-containing heterocyclic compound are preferable. Trialkylamines are particularly preferable among the nitrogen-containing compounds (I), and imidazoles are particularly preferable among the nitrogen-containing heterocyclic compounds.

The acid diffusion controllers may be used either individually or in combination of two or more.

The amount of the acid diffusion controller to be added is usually 10 parts by weight or less, preferably 0.001 to 5 parts by weigh, and more preferably 0.005 to 3 parts by weight for 100 parts by weight of the resin. If the amount of the acid diffusion controllers exceeds 10 parts by weight, there is a tendency that the lens of a projection aligner is polluted by the component eluted from the upper layer-forming composition.

The photoresist patterning method of the embodiment of the present invention will be described below.

As the substrate on which the photoresist film is formed by applying the photoresist composition, a silicon wafer, an aluminum-coated wafer, or the like may be used. In order to bring out the potential of the resist film to the maximum extent, an organic or inorganic antireflection film may be formed on the substrate as disclosed in JP-B-6-12452, for example.

The photoresist used is not particularly limited, and may be appropriately selected according to the purpose of the resist. As examples of the resist, a chemically-amplified positive-tone or negative-tone resist containing an acid generator can be given.

When the upper layer film produced from the composition of the embodiment is used, a positive-tone resist is particularly preferable. In the case of the chemically-amplified positive-tone resist, the acid-dissociating organic group in the polymer dissociates due to the action of the acid generated from the acid generator by exposure to radiation, to produce a carboxyl group, for example. The acid increases the solubility of the resist in the irradiated part in an alkaline developer to the extent that the irradiated part is dissolved and removed by an alkaline developer to produce a positive tone resist pattern.

The photoresist film can be obtained by dissolving the resin for forming the photoresist film in a suitable solvent at a solid component concentration of 0.1 to 20 wt %, for example, filtering the solution through a filter with a pore size of about 30 nm, for example, to obtain a resist solution, applying the resist solution on a substrate by an appropriate method such as rotation application, cast coating, or roll coating, and preliminarily baking (hereinafter referred to as "PB") the coated resin composition to vaporize the solvent. In this case, a commercially available resist solution may be used as is.

The step of forming an upper layer film on the photoresist film using the upper layer-forming composition comprises applying the upper layer-forming composition of the embodiment on the photoresist film and, usually, again baking the coating to obtain the upper layer film of the embodiment. This step is carried out in order to protect the photoresist film and to prevent pollution of the lens of a projection aligner due to elution of components from the photoresist film into the liquid used for the immersion lithography.

In this instance, the closer the thickness of the upper layer film to an anisoploid of $\lambda/4$ m (wherein $\lambda$ is the wavelength of radiation and m is the refractive index of the upper layer film), the greater the antireflection effect on the upper side surface of the resist film. Therefore, it is preferable to bring the thickness of the upper layer film close to this value. In the embodiment, either prebaking after the application of the resist solution or baking after the application of the upper layer film forming-composition solution may be omitted for simplification of the process.

A step of forming a resist pattern by irradiating the photoresist film and the upper layer film with light in water as a medium through a mask having a specified pattern and developing the pattern, comprises a step of carrying out liquid immersion lithography and, after baking at a specified temperature, developing the pattern.

It is possible to adjust the pH of water filled between the photoresist film and the upper layer film. A particularly preferable liquid medium is pure water.

As the radiation used for the liquid immersion lithography, various radiations such as visible rays; ultraviolet rays such as a g-line and i-line; deep ultraviolet rays such as an excimer laser; X rays such as a synchrotron radiation line; and charged particle beams such as an electron beams can be selectively used according to the photoresist film and the combination of the photoresist film and the upper layer film for use in immersion lithography. In particular, it is preferable to use light from an ArF excimer laser (wavelength: 193 nm) or a KrF excimer laser (wavelength: 248 nm).

It is preferable to perform post exposure baking (hereinafter abbreviated as "PEB") in order to provide the resist film with improved resolution, pattern profile, developability, and the like. The baking temperature is usually about 30 to 200° C., and preferably 50 to 150° C., although the baking temperature is appropriately adjusted according to the resist used and the like.

The photoresist film is then developed using a developer and washed to form a desired resist pattern. In this case, it is not necessary to add a step of delaminating the upper film for immersion lithography. The upper film is completely removed during development or washing after the development. This is an important feature of the embodiment.

As the developer used when forming the resist pattern in the embodiment, an alkaline aqueous solution in which sodium hydroxide, potassium hydroxide, sodium carbonate, sodium silicate, meta sodium silicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo-[5,4,0]-7-undecene, 1,5-diazabicyclo-[4,3,0]-5-nonane, or the like is dissolved can be used. An appropriate amount of a water-soluble organic solvent such as alcohols including methanol and ethanol or a surfactant can be added to the developer. When developed using these alkaline aqueous solution, the resist film is usually washed with water after the development.

EXAMPLES

The embodiment of the present invention will be described in more detail by Synthesis Examples of the copolymer (polymer) and Examples of the upper layer-forming composition. However, these examples should not be construed as limiting the present invention. In the examples, "part" refers to "part by mass" unless otherwise indicated.

Resin Synthesis Example

Resins (A-1) to (A-10) which can form a film stable in water during exposure to radiation and is dissolved in a developer after resist pattern formation were synthesized according to the method described below. Mw and Mn of the resins (A-1) to (A-10) were measured by gel permeation chromatography (GPC) using GPC columns ("G2000H$_{XL}$"×2, "G3000HX$_{XL}$"×1, and "G4000H$_{XL}$"×1, manufactured by Tosoh Corp.) in a high performance GPC apparatus ("HLC-8120" manufactured by Tosoh Corp.) under the following conditions; Flow rate: 1.0 ml/minute, eluate: tetrahydrofuran, column temperature: 40° C., standard reference material: monodispersed polystyrene.

The radically polymerizable monomers used for the synthesis of the resins are shown in the following formulas (M-1) to (M-6), (S-1), and (S-2).

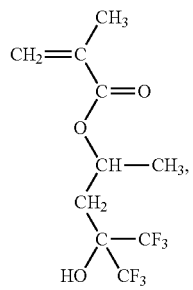

(M-1)

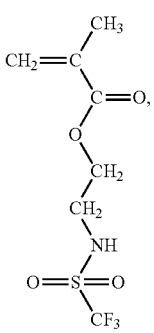

(M-2)

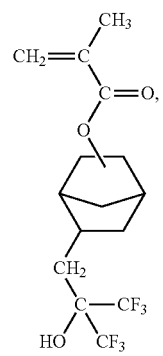

(M-3)

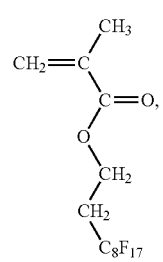

(M-4)

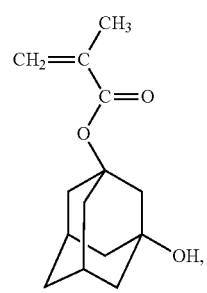

(M-5)

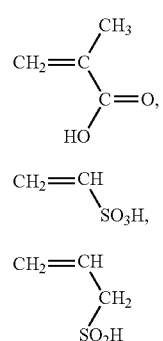

(M-6)

$$CH_2=CH-SO_3H,$$ (S-1)

$$CH_2=CH-CH_2-SO_2H$$ (S-2)

The monomer solutions were prepared by dissolving monomers of a weight corresponding to mol % shown in Table 1 and 2,2'-azobis(methyl-2-methylpropionate) as an initiator in 200 g of isopropanol. The total amount of the monomers used for the reaction was adjusted to 100 g. The amount of the initiator is indicated by gram (g) to 100 g of the monomers.

A 1500 ml three-necked flask equipped with a thermometer and a dropping funnel was charged with 100 g of isopropanol and purged with nitrogen for 30 minutes. The contents of the flask were heated to 80° C. while stirring using a magnetic stirrer. The monomer solution prepared as above was put into the dropping funnel and added to the flask dropwise over three hours. After the addition, the mixture was reacted for three hours, and allowed to cool to 30° C. or less, thereby obtaining a copolymer solution.

The resulting copolymer was post-treated according to the following method.

The copolymer solution was condensed to 200 g and transferred to a separating funnel together with 200 g of methanol and 1600 g of n-heptane. The mixture was sufficiently stirred and the lower layer was separated. The separated lower layer was mixed with 200 g of methanol and 1600 g of n-heptane and the mixture was transferred to a separating funnel to separate the lower layer. The solvent in the resulting lower layer was replaced with dibutyl ether. For comparison, a resin was obtained by replacing the solvent with 4-methyl-2-pentanol instead of the dibutyl ether. The solid component concentration of the sample of which the solvent was replaced was calculated from the weight of the residue when 0.3 g of the resin solution placed on an aluminum pan was heated on a hot plate at 140° C. for two hours. The calculated value was used for preparation of solutions for an upper layer-forming composition and calculation of the yields in the subsequent experiments. After the solvent replacement with dibutyl ether, the Mw and Mw/Mn (molecular weight dispersion) of the resin were measured. The results are shown in Table 1. The properties of the resin of which the solvent was replaced with 4-methyl-2-pentanol were almost the same.

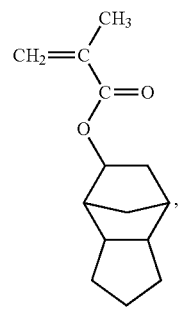
(1-2)

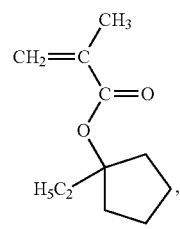
(1-3)

A monomer solution was prepared by dissolving 53.93 g (50 mol %) of compound (1-1), 10.69 g (10 mol %) of compound (1-2), and 35.38 g (40 mol %) of compound (1-3) in 195 g of 2-butanone, and further adding 2.24 g of dimethyl 2,2'-azobis(2-methylpropionate). A 1000 ml three-necked flask was charged with 100 g of 2-butanone and nitrogen gas was bubbled into the flask for 30 minutes. After the nitrogen purge, the flask was heated to 80° C. while stirring and the

TABLE 1

| Resin | Amount of monomer used for reaction, mol % | | | | | | | | Amount of initiator | Mw | Mw/Mn |
|---|---|---|---|---|---|---|---|---|---|---|---|
| | M-1 | M-2 | M-3 | M-4 | M-5 | M-6 | S-1 | S-2 | | | |
| A-1 | 100 | — | — | — | — | — | — | — | 6.5 | 11800 | 2.3 |
| A-2 | — | 100 | — | — | — | — | — | — | 6.5 | 10700 | 2.1 |
| A-3 | 95 | — | — | — | — | — | 5 | — | 6.3 | 6120 | 1.8 |
| A-4 | 90 | — | — | — | — | — | 10 | — | 6.2 | 6000 | 1.7 |
| A-5 | 85 | — | — | — | — | — | 15 | — | 6.0 | 5830 | 1.7 |
| A-6 | 95 | — | — | — | — | — | — | 5 | 6.3 | 6080 | 1.7 |
| A-7 | 90 | — | — | — | — | — | — | 10 | 6.2 | 5900 | 1.7 |
| A-8 | 85 | — | — | — | — | — | — | 15 | 6.0 | 5730 | 1.5 |
| A-9 | 42.5 | — | 42.5 | — | — | — | — | 15 | 6.0 | 4830 | 1.5 |
| A-10 | — | — | — | 30 | 40 | 30 | — | — | 6.0 | 7300 | 1.6 |

Preparation of Radiation-Sensitive Resin Compositions

The radiation-sensitive resin compositions for forming photoresist films were prepared using the following method. Preparation of Radiation-Sensitive Resin (A')

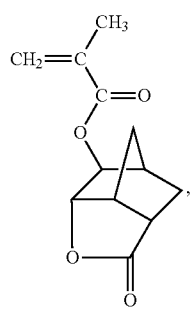
(1-1)

above monomer solution was added dropwise using a dropping funnel over three hours. The polymerization reaction was carried out for six hours after initiation of the addition of the monomer solution. After completion of polymerization, the polymer solution was cooled with water to 30° C. or lower and poured into 2000 g of methanol. A white precipitate produced was collected by filtration.

The white powder collected by filtration was washed twice with 400 g of methanol in a slurry state, filtered again, and dried at 50° C. for 17 hours to obtain a polymer in the form of a white powder (72 g, yield 72%). The polymer was a copolymer with an Mw of 8,500 and the mol % ratio of the recurring units of the compound (1-1), compound (1-2), and compound (1-3) determined by $^{13}$C-NMR was 52.2:8.0:39.8 (mol %).

A homogeneous solution was prepared from the copolymer (A'), as a resin component, and the other components shown below in proportions shown in Table 2, and filtered through a membrane filter with a pore size of 500 nm to obtain the composition solutions of Examples and Comparative Examples. In the examples, "part" refers to "part by weight" unless otherwise indicated.

Acid Generator (B)

B-1: triphenylsulfonium nonafluoro-n-butanesulfonate

B-2: 1-(4-n-butoxynaphthalen-1-yl)tetrahydrothiophenium nonafluoro-n-butanesulfonate Acid Diffusion Controller (C)

C-1: R-(+)-(tert-butoxycarbonyl)-2-piperidinemethanol

Solvent (D)

D-1: □-butyrolactone (GBL)

D-2: propylene glycol monoethyl ether acetate (PEGMEA)

TABLE 2

| | Acid dissociable group-containing resin (A') (part by weight) | Acid generator (B) (part by weight) | Acid diffusion controller (C) (part by weight) | Solvent (D) (part by weight) |
|---|---|---|---|---|
| Radiation-sensitive resin composition | A' (100) | B-1 (1.5) B-2 (6) | C-1 (0.52) | D-1 (26.5) D-2 (1368.5) |

Examples 1 to 30 and 37 to 48 and Comparative Examples 1 to 11

Upper layer-forming compositions for use in immersion lithography were produced using the resins obtained in the above examples. 4 g of the solid component of each of the resins shown in Table 1 in turn and 96 g of a solvent or a mixture of solvents at a ratio shown in Table 4 or Table 5 were mixed and stirred for two hours. The mixture was filtered through a filter with a pore size of 200 nm to obtain a solution. In Table 4, DBE stands for dibutyl ether, 4M2P stands for 4-methyl-2-pentanol, and DIAE stands for diisoamyl ether. In Tables 4 and 5, the solvent ratio for mixed solvents is shown by weight. The upper layer-forming compositions obtained were evaluated by the following methods. The results are shown in Tables 4 and 5.

Examples 31 to 36

Homogeneous solutions were prepared from the resin A-1 obtained in the above Synthesis Example as a resin component and the other components shown below in the proportion shown in Table 3, and filtered through a membrane filter with a pore size of 500 nm to obtain the upper layer-forming compositions for use in immersion lithography of the Examples. In the examples, "part" refers to "part by weight" unless otherwise indicated. The upper layer-forming compositions obtained were evaluated by the following methods. The results are shown in Table 4.

Acid or Acid Generator (B')

B'-1: triphenylsulfonium nonafluoro-n-butanesulfonate

B'-3: perfluorobutanesulfonic acid

Acid Diffusion Controller (C)

C-1: R-(+)-(tert-butoxycarbonyl)-2-piperidinemethanol

Solvent (D)

D-3: dibutyl ether (DBE)

D-4: 4-methyl-2-pentanol (4M2P)

TABLE 3

| | Resin (A) | Acid generator (B') | Acid diffusion controller (C) | Solvent (D) |
|---|---|---|---|---|
| Example 31 | A-1 (100) | B'-1 (0.3) | — | D-3 (2400) |
| Example 32 | A-1 (100) | B'-1 (0.3) | — | D-3 (1680) D-4 (720) |
| Example 33 | A-1 (100) | B'-3 (0.5) | — | D-3 (2400) |
| Example 34 | A-1 (100) | B'-3 (0.5) | — | D-3 (1680) D-4 (720) |
| Example 35 | A-1 (100) | B'-3 (0.5) | C-1 (0.054) | D-3 (2400) |
| Example 36 | A-1 (100) | B'-3 (0.5) | C-1 (0.054) | D-3 (1680) D-4 (720) |

Evaluation Method (1) Evaluation Method of Solubility (Solubility)

In Examples 1 to 30, Examples 37 to 48, and Comparative Examples 1 to 10, 4 g of the resin for upper layer-forming composition was added to 96 g of the solvent shown in Table 4 or Table 5, and the mixture was stirred for three hours at 100 rpm using a three-one motor. In Examples 1 to 30 and Examples 37 to 48, the resin obtained by drying the resin solution at 100° C. for 24 hours to a solid state was used. In the evaluation, the resin producing a homogeneous mixture with the solvent was evaluated to have good solubility and indicated as "Good", and the resin producing undissolved matter or exhibiting turbidity was evaluated to have poor solubility and indicated as "Bad".

In Examples 31 to 36, in the case in which the upper layer-forming composition shown in Table 3 produced a homogeneous solution, the composition was evaluated as having good solubility and indicated as "Good", and in the case in which an undissolved matter or turbidity was produced, the composition was evaluated as having poor solubility and indicated as "Bad".

(2) Evaluation Method of Upper Layer Film Removability (Removability)

The upper layer film-forming compositions were spin-coated on eight-inch silicon wafers using "CLEAN TRACK ACT8" (manufactured by Tokyo Electron, Ltd.) and baked at 90° C. for 60 seconds to form coatings with a thickness of 90 nm. The thickness was measured by using "Lambda Ace VM-90" (manufactured by Dainippon Screen Mfg. Co., Ltd.). After paddle development (developer: 2.38% aqueous solution of TMAH) for 60 seconds using "CLEAN TRACK ACT8", the wafers were dried by spinning to observe the surfaces. If development was completed with no residues being observed, the removability was judged to be "Good". If a residue was observed, the removability was judged to be "Bad".

(3) Evaluation Method of Intermixing (Intermixing)

A radiation-sensitive resin composition containing the above radiation-sensitive resin (A') as a resin component was spin-coated on an eight-inch silicon wafer treated with HMDS (100° C. for 60 seconds) using "CLEAN TRACK ACT8" (manufactured by Tokyo Electron, Ltd.) and prebaked on a hot plate at 130° C. for 90 seconds to form a coating with a thickness of 300 nm. The above upper layer-forming composition was applied on the resulting coating by spin coating and prebaked (PB) at 90° C. for 60 seconds to obtain a coating with a thickness of 90 nm. Ultra-pure water was injected onto the coating for 60 seconds from a rinse nozzle of "CLEAN TRACK ACT8", followed by spin-drying at 4,000 rpm for 15 minutes and paddle development using the LD nozzle of the "CLEAN TRACK ACT8" for 60 seconds to remove the upper layer. A 2.38% TMAH aqueous solution was used as a developer in the development step. Although the coating for use in immersion lithography was removed by the development step, the resist coating film which was not exposed to radiation remained as is. The thickness was measured using "Lambda Ace VM-90" (manufactured by Dainippon Screen Mfg. Co., Ltd.) before and after the experiment. If the change of the resist thickness was within 0.5%, the resist coating was judged to exhibit no intermixing with the upper layer film for use in immersion lithography and the intermixing properties were indicated as "Good", and if the change of the resist thickness was more than 0.5%, the intermixing properties were indicated as "Bad."

(4) Stability Evaluation of Upper Layer-Forming Composition for Use in Immersion Lithography in Water (Water Resistance)

A coating (thicknesses: 30 nm) of the upper layer-forming composition was formed by spin-coating and baking (PB) at 90° C. for 60 seconds on an eight-inch silicon wafer using "CLEAN TRACK ACT8" (manufactured by Tokyo Electron, Ltd.). The thickness was measured by using "Lambda Ace VM-90". Ultra-pure water was injected onto the wafer for 60 seconds from the rinse nozzles of "CLEAN TRACK ACT8", followed by spin-drying at 4,000 rpm for 15 seconds. The thickness of this substrate was measured again. When the amount of decrease in the thickness was 3% or less of the initial thickness, the stability was judged to be acceptable and indicated as "Good", and if more than 3%, indicated as "Bad".

(5) Evaluation of Patterning 1

The evaluation method of patterning of a resist using the above upper layer film is described below.

After forming a coating with a thickness of 77 nm (after PB at 205° C. for 60 seconds) using an underlayer reflection preventing film "ARC29A" (manufactured by Brewer Science, Inc.) on an eight-inch silicon wafer by spin coating using "CLEAN TRACK ACT8" (manufactured by Tokyo Electron, Ltd.), patterning was carried out using the radiation-sensitive resin composition containing the above-mentioned radiation-sensitive resin (A') as the resin component. A film with a thickness of 205 nm was prepared by spin coating and PB (130° C., 90 seconds), followed by forming the upper layer film by spin coating and PB (90° C., 60 seconds) to obtain a coating with a thickness of 90 nm. Next, after exposure under the conditions of NA of 0.78, sigma of 0.85, and ⅔ Ann using an ArF projection aligner "S306C" (manufactured by Nikon Corp.), ultra-pure water was injected onto the wafer from rinse nozzles of "CLEAN TRACK ACT8" for 60 seconds, followed by spin-drying at 4,000 rpm for 15 seconds. The resulting coating was baked (PEB) at 130° C. for 90 seconds on a "CLEAN TRACK ACT8" hot plate, developed by paddle development using the LD nozzle of the "CLEAN TRACK ACT8" for 60 seconds, and rinsed with ultra-pure water, followed by spin-drying at 4,000 rpm for 15 seconds.

90 nm line-and-space (1L1S) patterns were observed using a scanning electron microscope ("S-9380" manufactured by Hitachi High-Tech Fielding Corporation) to determine an exposure dose at which a 1:1 line width was 90 nm (optimum exposure dose). The minimum line-and-space dimension resolved by the optimum exposure dose was taken as the resolution. The results are shown in Table 4. The cross-sectional configuration of 90 nm line-and-space patterns were observed using a scanning electron microscope ("S-4200" manufactured by Hitachi High-Tech Fielding Corporation). FIG. 1 shows the cross-sectional configuration of the line-and-space pattern. A line width Lb in the middle of a pattern 2 on a coating formed on a substrate 1 and a line width La on the upper part of the coating were measured. The configurations were judged as "rectangular" when $0.9 <= (La-Lb)/Lb <= 1.1$ was satisfied; as "tapered" when $(La-Lb)/Lb < 0.9$ was satisfied; and as "head-projected" when $(La-Lb)/Lb > 1.1$ was satisfied.

In the case of Comparative Example 11, the patterning was evaluated by spin coating the radiation-sensitive resin composition and PB (130° C., 90 seconds) after forming a film with a thickness of 205 nm without forming an upper layer film.

(6) Evaluation of Patterning 2

The evaluation method of patterning of a resist using the above upper layer film is described below.

After forming a coating with a thickness of 77 nm (after PB at 205° C. for 60 seconds) using an underlayer reflection preventing film "ARC29A" (manufactured by Brewer Science, Inc.) on an eight-inch silicon wafer by spin coating using "CLEAN TRACK ACT8" (manufactured by Tokyo Electron, Ltd.), patterning was carried out using "ArF AR1682J" (manufactured by JSR Corp.). The "AR1682J" film with a thickness of 205 nm was prepared by spin coating and PB (110° C., 90 seconds), followed by forming the upper layer film by spin coating and PB (90° C., 60 seconds) to obtain a coating with a thickness of 90 nm. Next, after exposure under the conditions of NA of 0.78, sigma of 0.85, and ⅔ Ann using an ArF projection aligner "S306C" (manufactured by Nikon Corp.), ultra-pure water was injected onto the wafer from rinse nozzles of "CLEAN TRACK ACT8" for 60 seconds, followed by spin-drying at 4000 rpm for 15 seconds. The resulting coating was baked (PEB) at 110° C. for 90 seconds on a "CLEAN TRACK ACT8" hot plate, developed by paddle development using the LD nozzle of the "CLEAN TRACK ACT8" for 60 seconds, and rinsed with ultra-pure water, followed by spin-drying at 4000 rpm for 15 seconds.

90 nm line-and-space (1L1S) patterns were observed using a scanning electron microscope ("S-9380" manufactured by Hitachi High-Tech Fielding Corporation) to determine an exposure dose at which a 1:1 line width was 90 nm (optimum exposure dose). The minimum line-and-space dimension resolved by the optimum exposure dose was taken as the resolution. The results are shown in Table 4. In addition, the cross-sectional configuration of a 90 nm line-and-space pattern was observed as shown in FIG. 1 to measure the line width Lb in the middle of the film and the line width La on the upper part of the film. The configuration was judged as "rectangular" when $0.9 <= (La-Lb)/Lb <= 1.1$ was satisfied; as "tapered" when $(La-Lb)/Lb < 0.9$ was satisfied; and as "head-projected" when $(La-Lb)/Lb > 1.1$ was satisfied.

In the case of Comparative Example 11, the patterning was evaluated without forming an upper layer film after forming a film with a thickness of 205 nm by spin coating the "AR1682J", followed by PB (110° C., 90 seconds).

(7) Minimum Amount of Application

In Examples 1 to 30 and Examples 37 to 48, 4 g of the solid component of the resin shown in Table 1 and 96 g of a solvent or a mixture of solvents at a ratio shown in Table 4 or Table 5 were mixed and stirred for two hours. The mixture was filtered through a filter with a pore size of 200 nm to obtain a solution, which was coated on an eight-inch silicon wafer using "CLEAN TRACK ACT8" (manufactured by Tokyo Electron, Ltd.) and baked (PB) at 90° C. for 60 seconds. The amount of application was changed at a 0.25 ml interval to determine the minimum amount for uniformly coating 95% of the surface of the eight-inch silicon wafer with the upper layer-forming composition.

In Examples 31 to 36, the upper layer film forming-compositions shown in Table 3 were coated on an eight-inch silicon wafer using "CLEAN TRACK ACT8" (manufactured by Tokyo Electron, Ltd.) and baked (PB) at 90° C. for 60 seconds. The amount of application was changed at a 0.25 ml interval to determine the minimum amount for uniformly coating 95% of the surface of the eight-inch silicon wafer with the upper layer-forming composition.

(8) Capability of Suppressing Elusion from Resist to Ultra-Pure Water (Elusion of Anion Part)

A 30×30 cm square silicon rubber sheet (manufactured by Kureha Elastomer Co., Ltd.) of which the center was hollowed in a circle with a diameter of 11.3 cm was placed on the center of an eight-inch silicon wafer which was previously treated with HMDS (100° C. for 60 seconds) using "CLEAN TRACK ACT8" (manufactured by Tokyo Electron, Ltd.). The circular hollowed area of the center of the silicone rubber sheet was filled with 10 ml of ultra-pure water using a 10 ml one-mark pipette.

After forming a coating with a thickness of 77 nm (after PB at 205° C. for 60 seconds) using an underlayer reflection preventing film "ARC29A" (manufactured by Brewer Science, Inc.) on an eight-inch silicon wafer by spin coating using "CLEAN TRACK ACT8" (manufactured by Tokyo Electron, Ltd.), the radiation-sensitive resin composition containing the above-mentioned radiation-sensitive resin (A') as the resin component was spin-coated and baked (PB) at 115° C. for 60 seconds to obtain a film with a thickness of 205 nm. After the PB, a coating with a thickness of 90 nm prepared by spin coating the upper layer-forming composition and baking (PB) at 90° C. for 60 seconds was placed on the silicone rubber sheet so as to cause the coating to come in contact with the ultra-pure water. This state was maintained for 10 seconds measured by a stopwatch, whereupon the silicon wafer was removed. After completion of the experiment, the ultra-pure water was collected using a glass syringe for use as the analytical sample. The recovery rate of the ultra-pure water after completion of the experiment was 95% or more.

The peak intensity of the anion part of the photoacid generator in the ultra-pure water obtained by the above experiment was measured by liquid chromatography mass spectrometry (LC-MS) (LC section: "SERIES 1100" manufactured by AGILENT, MS section: "Mariner" manufactured by Perseptive Biosystems, Inc.) using a column ("CAPCELL PAK MG" manufactured by Shiseido Co., Ltd.) at a flow rate of 0.2 ml/min, and using a solution of 0.1 wt % formic acid in a 3:7 mixture of water and methanol as an eluant at 35° C. In this instance, peak intensities of the aqueous solutions of the photoacid generator used for the radiation-sensitive resin composition, in which the radiation-sensitive resin (A') is used as a resin component, at concentrations of 1 ppb, 10 ppb, and 100 ppb were measured under the above conditions to prepare a calibration curve. The eluted amount was calculated from the above peak intensity using this calibration curve.

(9) Solvent Viscosity Measurement

The viscosity was measured according to JIS K2283 using a Canon-Fenske viscometer.

TABLE 4

| | | Resin | Solvent Type | Viscosity** | Solubility | Removability | Intermixing | Delamination |
|---|---|---|---|---|---|---|---|---|
| Example | 1 | A-1 | DBE = 100 | 0.7 | Good | Good | Good | Good |
| | 2 | A-1 | 4M2P/DBE = 30/70 | 1.5 | Good | Good | Good | Good |
| | 3 | A-1 | 4M2P/DBE = 70/30 | 2.2 | Good | Good | Good | Good |
| | 4 | A-2 | DBE = 100 | 0.7 | Good | Good | Good | Good |
| | 5 | A-2 | 4M2P/DBE = 30/70 | 1.5 | Good | Good | Good | Good |
| | 6 | A-2 | 4M2P/DBE = 70/30 | 2.2 | Good | Good | Good | Good |
| | 7 | A-3 | DBE = 100 | 0.7 | Good | Good | Good | Good |
| | 8 | A-3 | 4M2P/DBE = 30/70 | 1.5 | Good | Good | Good | Good |
| | 9 | A-3 | 4M2P/DBE = 70/30 | 2.2 | Good | Good | Good | Good |
| | 10 | A-4 | DBE = 100 | 0.7 | Good | Good | Good | Good |
| | 11 | A-4 | 4M2P/DBE = 30/70 | 1.5 | Good | Good | Good | Good |
| | 12 | A-4 | 4M2P/DBE = 70/30 | 2.2 | Good | Good | Good | Good |
| | 13 | A-5 | DBE = 100 | 0.7 | Good | Good | Good | Good |
| | 14 | A-5 | 4M2P/DBE = 30/70 | 1.5 | Good | Good | Good | Good |
| | 15 | A-5 | 4M2P/DBE = 70/30 | 2.2 | Good | Good | Good | Good |
| | 16 | A-6 | DBE = 100 | 0.7 | Good | Good | Good | Good |
| | 17 | A-6 | 4M2P/DBE = 30/70 | 1.5 | Good | Good | Good | Good |
| | 18 | A-6 | 4M2P/DBE = 70/30 | 2.2 | Good | Good | Good | Good |
| | 19 | A-7 | DBE = 100 | 0.7 | Good | Good | Good | Good |
| | 20 | A-7 | 4M2P/DBE = 30/70 | 1.5 | Good | Good | Good | Good |
| | 21 | A-7 | 4M2P/DBE = 70/30 | 2.2 | Good | Good | Good | Good |
| | 22 | A-8 | DBE = 100 | 0.7 | Good | Good | Good | Good |
| | 23 | A-8 | 4M2P/DBE = 30/70 | 1.5 | Good | Good | Good | Good |
| | 24 | A-8 | 4M2P/DBE = 70/30 | 2.2 | Good | Good | Good | Good |
| | 25 | A-9 | DBE = 100 | 0.7 | Good | Good | Good | Good |
| | 26 | A-9 | 4M2P/DBE = 30/70 | 1.5 | Good | Good | Good | Good |
| | 27 | A-9 | 4M2P/DBE = 70/30 | 2.2 | Good | Good | Good | Good |
| | 28 | A-10 | DBE = 100 | 0.7 | Good | Good | Good | Good |
| | 29 | A-10 | 4M2P/DBE = 30/70 | 1.5 | Good | Good | Good | Good |
| | 30 | A-10 | 4M2P/DBE = 70/30 | 2.2 | Good | Good | Good | Good |
| | 31 | | Composition shown | 0.7 | Good | Good | Good | Good |
| | 32 | | in Table 3 | 1.5 | Good | Good | Good | Good |
| | 33 | | | 0.7 | Good | Good | Good | Good |
| | 34 | | | 1.5 | Good | Good | Good | Good |
| | 35 | | | 0.7 | Good | Good | Good | Good |
| | 36 | | | 1.5 | Good | Good | Good | Good |
| | 37 | A-5 | 4M2P/DIAE = 60/40 | 2.2 | Good | Good | Good | Good |
| | 38 | * | 4M2P/DIAE = 60/40 | 2.2 | Good | Good | Good | Good |
| Comparative Example | 1 | A-1 | 4M2P = 100 | 5.2 | Good | Good | Good | Good |
| | 2 | A-2 | 4M2P = 100 | 5.2 | Good | Good | Good | Good |
| | 3 | A-3 | 4M2P = 100 | 5.2 | Good | Good | Good | Good |

TABLE 4-continued

|  |  |  |  |  |  |  |  |
|---|---|---|---|---|---|---|---|
|  | 4 | A-4 | 4M2P = 100 | 5.2 | Good | Good | Good | Good |
|  | 5 | A-5 | 4M2P = 100 | 5.2 | Good | Good | Good | Good |
|  | 6 | A-6 | 4M2P = 100 | 5.2 | Good | Good | Good | Good |
|  | 7 | A-7 | 4M2P = 100 | 5.2 | Good | Good | Good | Good |
|  | 8 | A-8 | 4M2P = 100 | 5.2 | Good | Good | Good | Good |
|  | 9 | A-9 | 4M2P = 100 | 5.2 | Good | Good | Good | Good |
|  | 10 | A-9 | 4M2P = 100 | 5.2 | Good | Good | Good | Good |
|  | 11 | — | — | — | — | — | — | — |

|  |  |  | Solvent | | Patterning evaluation 1 | | Patterning evaluation 2 | | Coating amount (ml) | Elusion of anion (ppb) |
|---|---|---|---|---|---|---|---|---|---|---|
|  |  | Resin | Type | | Resolution | Shape | Resolution | Shape | | |
| Example | 1 | A-1 | DBE = 100 | | 85 nm | Rect | 80 nm | Rect | 0.50 | 0.3 |
|  | 2 | A-1 | 4M2P/DBE = 30/70 | | 85 nm | Rect | 80 nm | Rect | 0.75 | 0.8 |
|  | 3 | A-1 | 4M2P/DBE = 70/30 | | 85 nm | Rect | 80 nm | Rect | 1.25 | 1.7 |
|  | 4 | A-2 | DBE = 100 | | 85 nm | Rect | 80 nm | Rect | 0.50 | 1.3 |
|  | 5 | A-2 | 4M2P/DBE = 30/70 | | 85 nm | Rect | 80 nm | Rect | 0.75 | 4.4 |
|  | 6 | A-2 | 4M2P/DBE = 70/30 | | 85 nm | Rect | 80 nm | Rect | 1.25 | 6.3 |
|  | 7 | A-3 | DBE = 100 | | 85 nm | Rect | 80 nm | Rect | 0.50 | 0.2 |
|  | 8 | A-3 | 4M2P/DBE = 30/70 | | 85 nm | Rect | 80 nm | Rect | 0.75 | 0.6 |
|  | 9 | A-3 | 4M2P/DBE = 70/30 | | 85 nm | Rect | 80 nm | Rect | 1.25 | 1.2 |
|  | 10 | A-4 | DBE = 100 | | 85 nm | Rect | 80 nm | Rect | 0.50 | 0.2 |
|  | 11 | A-4 | 4M2P/DBE = 30/70 | | 85 nm | Rect | 80 nm | Rect | 0.75 | 0.7 |
|  | 12 | A-4 | 4M2P/DBE = 70/30 | | 85 nm | Rect | 80 nm | Rect | 1.25 | 1.3 |
|  | 13 | A-5 | DBE = 100 | | 85 nm | Rect | 80 nm | Rect | 0.50 | 0.3 |
|  | 14 | A-5 | 4M2P/DBE = 30/70 | | 85 nm | Rect | 80 nm | Rect | 0.75 | 0.8 |
|  | 15 | A-5 | 4M2P/DBE = 70/30 | | 85 nm | Rect | 80 nm | Rect | 1.25 | 1.6 |
|  | 16 | A-6 | DBE = 100 | | 85 nm | Rect | 80 nm | Rect | 0.50 | 0.2 |
|  | 17 | A-6 | 4M2P/DBE = 30/70 | | 85 nm | Rect | 80 nm | Rect | 0.75 | 0.6 |
|  | 18 | A-6 | 4M2P/DBE = 70/30 | | 85 nm | Rect | 80 nm | Rect | 1.25 | 1.4 |
|  | 19 | A-7 | DBE = 100 | | 85 nm | Rect | 80 nm | Rect | 0.50 | 0.2 |
|  | 20 | A-7 | 4M2P/DBE = 30/70 | | 85 nm | Rect | 80 nm | Rect | 0.75 | 0.8 |
|  | 21 | A-7 | 4M2P/DBE = 70/30 | | 85 nm | Rect | 80 nm | Rect | 1.25 | 1.6 |
|  | 22 | A-8 | DBE = 100 | | 85 nm | Rect | 80 nm | Rect | 0.50 | 0.3 |
|  | 23 | A-8 | 4M2P/DBE = 30/70 | | 85 nm | Rect | 80 nm | Rect | 0.75 | 0.8 |
|  | 24 | A-8 | 4M2P/DBE = 70/30 | | 85 nm | Rect | 80 nm | Rect | 1.25 | 1.7 |
|  | 25 | A-9 | DBE = 100 | | 85 nm | Rect | 80 nm | Rect | 0.50 | 0.3 |
|  | 26 | A-9 | 4M2P/DBE = 30/70 | | 85 nm | Rect | 80 nm | Rect | 0.75 | 1.0 |
|  | 27 | A-9 | 4M2P/DBE = 70/30 | | 85 nm | Rect | 80 nm | Rect | 1.25 | 2.1 |
|  | 28 | A-10 | DBE = 100 | | 85 nm | Rect | 80 nm | Rect | 0.50 | 0.3 |
|  | 29 | A-10 | 4M2P/DBE = 30/70 | | 85 nm | Rect | 80 nm | Rect | 0.75 | 0.8 |
|  | 30 | A-10 | 4M2P/DBE = 70/30 | | 85 nm | Rect | 80 nm | Rect | 1.25 | 1.5 |
|  | 31 |  | Compostion shown | | 85 nm | Rect | 80 nm | Rect | 0.50 | 0.4 |
|  | 32 |  | in Table 3 | | 85 nm | Rect | 80 nm | Rect | 0.75 | 0.8 |
|  | 33 |  |  | | 85 nm | Rect | 80 nm | Rect | 0.50 | 0.5 |
|  | 34 |  |  | | 85 nm | Rect | 80 nm | Rect | 0.75 | 1.0 |
|  | 35 |  |  | | 85 nm | Rect | 80 nm | Rect | 0.50 | 0.5 |
|  | 36 |  |  | | 85 nm | Rect | 80 nm | Rect | 0.75 | 1.0 |
|  | 37 | A-5 | 4M2P/DIAE = 60/40 | | 85 nm | Rect | 85 nm | Rect | 1.00 | 1.2 |
|  | 38 | * | 4M2P/DIAE = 60/40 | | 85 nm | Rect | 85 nm | Rect | 1.00 | 1.3 |
| Comparative Example | 1 | A-1 | 4M2P = 100 | | 85 nm | Rect | 80 nm | Rect | 1.75 | 1.8 |
|  | 2 | A-2 | 4M2P = 100 | | 85 nm | Rect | 80 nm | Rect | 1.75 | 7.7 |
|  | 3 | A-3 | 4M2P = 100 | | 85 nm | Rect | 80 nm | Rect | 1.75 | 1.4 |
|  | 4 | A-4 | 4M2P = 100 | | 85 nm | Rect | 80 nm | Rect | 1.75 | 1.5 |
|  | 5 | A-5 | 4M2P = 100 | | 85 nm | Rect | 80 nm | Rect | 1.75 | 1.6 |
|  | 6 | A-6 | 4M2P = 100 | | 85 nm | Rect | 80 nm | Rect | 1.75 | 1.6 |
|  | 7 | A-7 | 4M2P = 100 | | 85 nm | Rect | 80 nm | Rect | 1.75 | 1.7 |
|  | 8 | A-8 | 4M2P = 100 | | 85 nm | Rect | 80 nm | Rect | 1.75 | 1.9 |
|  | 9 | A-9 | 4M2P = 100 | | 85 nm | Rect | 80 nm | Rect | 1.75 | 2.2 |
|  | 10 | A-9 | 4M2P = 100 | | 85 nm | Rect | 80 nm | Rect | 1.75 | 1.7 |
|  | 11 | — | — | | 85 nm | Rect | 80 nm | Rect | — | — |

*A-1/A-5 = 70/30
**Unit of viscosity: $\times 10^{-3}$ Pa·s

TABLE 5

|  |  |  | Solvent | | | | | |
|---|---|---|---|---|---|---|---|---|
|  |  | Resin | Type | Viscosity** | Solubility | Removability | Intermixing | Delamination |
| Example | 39 | A-1 | 4M2P/Decane = 70/30 | 2.2 | Good | Good | Good | Good |
|  | 40 | A-2 | 4M2P/Decane = 70/30 | 2.2 | Good | Good | Good | Good |
|  | 41 | A-3 | 4M2P/Decane = 70/30 | 2.2 | Good | Good | Good | Good |
|  | 42 | A-4 | 4M2P/Decane = 70/30 | 2.2 | Good | Good | Good | Good |

TABLE 5-continued

| | | Resin | Solvent Type | Patterning evaluation 1 Resolution | Shape | Patterning evaluation 2 Resolution | Shape | Coating amount (ml) | Elusion of anion (ppb) |
|---|---|---|---|---|---|---|---|---|---|
| | 43 | A-5 | 4M2P/Decane = 70/30 | 2.2 | Good | Good | Good | Good | |
| | 44 | A-6 | 4M2P/Decane = 70/30 | 2.2 | Good | Good | Good | Good | |
| | 45 | A-7 | 4M2P/Decane = 70/30 | 2.2 | Good | Good | Good | Good | |
| | 46 | A-8 | 4M2P/Decane = 70/30 | 2.2 | Good | Good | Good | Good | |
| | 47 | A-9 | 4M2P/Decane = 70/30 | 2.2 | Good | Good | Good | Good | |
| | 48 | A-10 | 4M2P/Decane = 70/30 | 2.2 | Good | Good | Good | Good | |
| Example | 39 | A-1 | 4M2P/Decane = 70/30 | 85 nm | Rect | 80 nm | Rect | 1.00 | 1.8 |
| | 40 | A-2 | 4M2P/Decane = 70/30 | 85 nm | Rect | 80 nm | Rect | 1.00 | 6.2 |
| | 41 | A-3 | 4M2P/Decane = 70/30 | 85 nm | Rect | 80 nm | Rect | 1.00 | 1.2 |
| | 42 | A-4 | 4M2P/Decane = 70/30 | 85 nm | Rect | 80 nm | Rect | 1.00 | 1.1 |
| | 43 | A-5 | 4M2P/Decane = 70/30 | 85 nm | Rect | 80 nm | Rect | 1.00 | 1.5 |
| | 44 | A-6 | 4M2P/Decane = 70/30 | 85 nm | Rect | 80 nm | Rect | 1.00 | 1.6 |
| | 45 | A-7 | 4M2P/Decane = 70/30 | 85 nm | Rect | 80 nm | Rect | 1.00 | 1.6 |
| | 46 | A-8 | 4M2P/Decane = 70/30 | 85 nm | Rect | 80 nm | Rect | 1.00 | 1.7 |
| | 47 | A-9 | 4M2P/Decane = 70/30 | 85 nm | Rect | 80 nm | Rect | 1.00 | 2.0 |
| | 48 | A-10 | 4M2P/Decane = 70/30 | 85 nm | Rect | 80 nm | Rect | 1.00 | 1.5 |

**Unit of viscosity: $\times 10^{-3}$ Pa·s

As shown in Tables 4 and 5, upper layer-forming compositions which can form a film stable in water during exposure to radiation in liquid immersion lithography and is easily dissolved in an alkaline developer were obtained in Examples 1 to 48. By using them, the amount of application and the amount of elusion can be reduced, while maintaining resolution and developability equivalent to a common method. The upper layer-forming composition of the embodiment of the present invention is thus very advantageous in the production of semiconductor devices.

Obviously, numerous modifications and variations of the present invention are possible in light of the above teachings. It is therefore to be understood that within the scope of the appended claims, the invention may be practiced otherwise than as specifically described herein.

The invention claimed is:

1. An upper layer-forming composition comprising:
a resin dissolvable in a developer for a photoresist film which is to be covered by the upper layer-forming composition to form a pattern by exposure to radiation; and
a solvent to dissolve the resin in the solvent, the solvent including a compound shown by a formula (1),

$$R^1\text{—}O\text{—}R^2 \quad (1)$$

wherein each of $R^1$ and $R^2$ independently represents a hydrocarbon group having 1 to 8 carbon atoms or a halogenated hydrocarbon group.

2. The upper layer-forming composition according to claim 1, wherein the solvent does not cause intermixing of the photoresist film and the upper layer-forming composition.

3. The upper layer-forming composition according to claim 1, wherein the solvent further includes a monohydric alcohol having 1 to 10 carbon atoms.

4. The upper layer-forming composition according to claim 2, wherein the solvent further includes a monohydric alcohol having 1 to 10 carbon atoms.

5. The upper layer-forming composition according to claim 1, wherein the resin includes a first recurring unit having a group shown by a formula (2), a second recurring unit having a group shown by a formula (3), a third recurring unit having a group shown by a formula (4), a fourth recurring unit having a carboxyl group, a fifth recurring unit having a sulfo group, or a combination thereof and has a weight average molecular weight measured by gel permeation chromatography of 2,000 to 100,000,

wherein
each of $R^3$ and $R^4$ independently represents a hydrogen atom, an alkyl group having 1 to 4 carbon atoms, or a fluoroalkyl group having 1 to 4 carbon atoms,
$R^5$ represents a fluoroalkyl group having 1 to 20 carbon atoms,
and
$R^6$ represents an organic group having a polar group.

6. The upper layer-forming composition according to claim 1, further comprising:
an acid, an acid-generator which generates an acid by being exposed to radiation, or a combination of the acid and the acid-generator.

7. A photoresist patterning method comprising:
applying a photoresist composition to a substrate to form a photoresist film;
applying the upper layer-forming composition according to claim 1 on the photoresist film to form an upper layer film;
irradiating the photoresist film and the upper layer film with radiation using a liquid as a medium through a mask having a specific pattern to form a resist pattern; and
developing the resist pattern.

8. A photoresist patterning method comprising:
applying a photoresist composition to a substrate to form a photoresist film;
applying the upper layer-forming composition according to claim 2 on the photoresist film to form an upper layer film;
irradiating the photoresist film and the upper layer film with radiation using a liquid as a medium through a mask having a specific pattern to form a resist pattern; and
developing the resist pattern.

9. A photoresist patterning method comprising:
applying a photoresist composition to a substrate to form a photoresist film;
applying the upper layer-forming composition according to claim 3 on the photoresist film to form an upper layer film;
irradiating the photoresist film and the upper layer film with radiation using a liquid as a medium through a mask having a specific pattern to form a resist pattern; and
developing the resist pattern.

10. A photoresist patterning method comprising:
applying a photoresist composition to a substrate to form a photoresist film;
applying the upper layer-forming composition according to claim 4 on the photoresist film to form an upper layer film;
irradiating the photoresist film and the upper layer film with radiation using a liquid as a medium through a mask having a specific pattern to form a resist pattern; and
developing the resist pattern.

11. A photoresist patterning method comprising:
applying a photoresist composition to a substrate to form a photoresist film;
applying the upper layer-forming composition according to claim 5 on the photoresist film to form an upper layer film;
irradiating the photoresist film and the upper layer film with radiation using a liquid as a medium through a mask having a specific pattern to form a resist pattern; and
developing the resist pattern.

12. A photoresist patterning method comprising:
applying a photoresist composition to a substrate to form a photoresist film;
applying the upper layer-forming composition according to claim 6 on the photoresist film to form an upper layer film;
irradiating the photoresist film and the upper layer film with radiation using a liquid as a medium through a mask having a specific pattern to form a resist pattern; and
developing the resist pattern.

* * * * *